US010325757B2

(12) United States Patent
Platzgummer et al.

(10) Patent No.: US 10,325,757 B2
(45) Date of Patent: Jun. 18, 2019

(54) ADVANCED DOSE-LEVEL QUANTIZATION OF MULTIBEAM-WRITERS

(71) Applicant: IMS Nanofabrication GmbH, Vienna (AT)

(72) Inventors: Elmar Platzgummer, Vienna (AT); Christoph Spengler, Vienna (AT); Hanns Peter Petsch, Vienna (AT)

(73) Assignee: IMS Nanofabrication GmbH, Vienna (AT)

( * ) Notice: Subject to any disclaimer, the term of this patent is extended or adjusted under 35 U.S.C. 154(b) by 0 days.

(21) Appl. No.: 15/880,374

(22) Filed: Jan. 25, 2018

(65) Prior Publication Data

US 2018/0218879 A1 Aug. 2, 2018

Related U.S. Application Data

(60) Provisional application No. 62/451,528, filed on Jan. 27, 2017.

(51) Int. Cl.
*H01J 37/09* (2006.01)
*H01J 37/31* (2006.01)
(Continued)

(52) U.S. Cl.
CPC ...... *H01J 37/3177* (2013.01); *H01J 37/3026* (2013.01); *H01J 2237/31769* (2013.01)

(58) Field of Classification Search
CPC ............... H01J 37/3026; H01J 37/3174; H01J 37/3177; H01J 37/045; H01J 37/3002;
(Continued)

(56) References Cited

U.S. PATENT DOCUMENTS 1,033,741 A 7/1912 Sims
1,420,104 A 6/1922 Howe et al.
(Continued)

FOREIGN PATENT DOCUMENTS

CN 202204836 U 4/2012
EP 0178156 A2 4/1986
(Continued)

OTHER PUBLICATIONS

Li et al., "Through-Silicon Interposer Technology for Heterogeneous Integration", Future Fab Intl., Issue 45, Apr. 25, 2013, 6 pgs.
(Continued)

*Primary Examiner* — David A Vanore
(74) *Attorney, Agent, or Firm* — KPPB LLP

(57) ABSTRACT

In a charged-particle multi-beam writing method a desired pattern is written on a target using a beam of energetic electrically charged particles, by imaging apertures of a pattern definition device onto the target, as a pattern image which is moved over the target. Thus, exposure stripes are formed which cover the region to be exposed in sequential exposures, and the exposure stripes are mutually overlapping, such that each area of said region is exposed by at least two different areas of the pattern image at different transversal offsets (Y1). For each pixel, a corrected dose amount is calculated by dividing the value of the nominal dose amount by a correction factor (q), wherein the same correction factor (q) is used with pixels located at positions which differ only by said transversal offsets (Y1) of overlapping stripes.

10 Claims, 19 Drawing Sheets

(51) Int. Cl.
*H01J 37/317* (2006.01)
*H01J 37/302* (2006.01)

(58) Field of Classification Search
CPC ......... H01J 37/3175; H01J 2237/31764; H01J 2237/3175; H01J 2237/31761; H01J 2237/31769; B82Y 10/00; B82Y 40/00; G03F 7/70475; G03F 7/704; G03F 7/70508
USPC ......... 250/492.22, 397, 398, 492.2; 430/296, 430/313, 942
See application file for complete search history.

(56) References Cited

U.S. PATENT DOCUMENTS

| | | | |
|---|---|---|---|
| 1,903,005 A | 3/1933 | McCuen | |
| 2,187,427 A | 1/1940 | Middleton | |
| 2,820,109 A | 1/1958 | Dewitz | |
| 2,920,104 A | 1/1960 | Brooks et al. | |
| 3,949,265 A | 4/1976 | Holl | |
| 4,467,211 A | 8/1984 | Smith | |
| 4,735,881 A | 4/1988 | Kobayashi et al. | |
| 4,899,060 A | 2/1990 | Lischke | |
| 5,103,101 A | 4/1992 | Berglund et al. | |
| 5,189,306 A * | 2/1993 | Frei | B82Y 10/00 250/398 |
| 5,260,579 A | 11/1993 | Yasuda et al. | |
| 5,369,282 A | 11/1994 | Arai et al. | |
| 5,393,987 A | 2/1995 | Abboud et al. | |
| 5,399,872 A | 3/1995 | Yasuda et al. | |
| 5,533,170 A * | 7/1996 | Teitzel | G03F 7/704 345/502 |
| 5,814,423 A | 9/1998 | Maruyama et al. | |
| 5,841,145 A | 11/1998 | Satoh et al. | |
| 5,847,959 A * | 12/1998 | Veneklasen | B82Y 10/00 700/121 |
| 5,857,815 A | 1/1999 | Bailey et al. | |
| 5,866,300 A | 2/1999 | Satoh et al. | |
| 5,876,902 A | 3/1999 | Veneklasen | |
| 5,933,211 A | 8/1999 | Nakasugi et al. | |
| 6,014,200 A | 1/2000 | Sogard et al. | |
| 6,043,496 A | 3/2000 | Tennant | |
| 6,049,085 A | 4/2000 | Ema | |
| 6,107,636 A | 8/2000 | Muraki | |
| 6,111,932 A | 8/2000 | Dinsmore | |
| 6,137,113 A | 10/2000 | Muraki | |
| 6,225,637 B1 | 5/2001 | Terashima et al. | |
| 6,229,595 B1 | 5/2001 | McKinley | |
| 6,252,339 B1 | 6/2001 | Kendall | |
| 6,258,511 B1 | 7/2001 | Okino et al. | |
| 6,280,798 B1 | 8/2001 | Ring et al. | |
| 6,333,138 B1 | 12/2001 | Higashikawa et al. | |
| 6,472,673 B1 | 10/2002 | Chalupka et al. | |
| 6,473,237 B2 | 10/2002 | Mei | |
| 6,552,353 B1 | 4/2003 | Muraki et al. | |
| 6,617,587 B2 | 9/2003 | Parker | |
| 6,768,123 B2 | 7/2004 | Giering | |
| 6,768,125 B2 | 7/2004 | Platzgummer et al. | |
| 6,835,937 B1 | 12/2004 | Muraki et al. | |
| 6,858,118 B2 | 2/2005 | Platzgummer et al. | |
| 6,897,454 B2 | 5/2005 | Sasaki et al. | |
| 6,965,153 B1 | 11/2005 | Ono et al. | |
| 7,084,411 B2 | 8/2006 | Lammer-Pachlinger et al. | |
| 7,124,660 B2 | 10/2006 | Chiang | |
| 7,129,024 B2 | 10/2006 | Ki | |
| 7,199,373 B2 | 4/2007 | Stengl et al. | |
| 7,201,213 B2 | 4/2007 | Leeson | |
| 7,214,951 B2 | 5/2007 | Stengl et al. | |
| 7,276,714 B2 | 10/2007 | Platzgummer et al. | |
| 7,368,738 B2 | 5/2008 | Platzgummer et al. | |
| 7,446,601 B2 | 11/2008 | LeChevalier | |
| 7,459,247 B2 | 12/2008 | Bijnen et al. | |
| 7,671,687 B2 | 3/2010 | LeChevalier | |
| 7,683,551 B2 | 3/2010 | Miyamoto et al. | |
| 7,687,783 B2 | 3/2010 | Platzgummer et al. | |
| 7,710,634 B2 | 5/2010 | Sandstrom | |
| 7,714,298 B2 | 5/2010 | Platzgummer et al. | |
| 7,741,620 B2 | 6/2010 | Doering et al. | |
| 7,772,574 B2 | 8/2010 | Stengl et al. | |
| 7,777,201 B2 | 8/2010 | Fragner et al. | |
| 7,781,748 B2 | 8/2010 | Platzgummer et al. | |
| 7,823,081 B2 | 10/2010 | Sato et al. | |
| 8,057,972 B2 | 11/2011 | Heinrich et al. | |
| 8,115,183 B2 | 2/2012 | Platzgummer et al. | |
| 8,178,856 B2 | 5/2012 | Nakayamada et al. | |
| 8,183,543 B2 | 5/2012 | Platzgummer et al. | |
| 8,198,601 B2 | 6/2012 | Platzgummer et al. | |
| 8,222,621 B2 | 7/2012 | Fragner et al. | |
| 8,227,768 B2 | 7/2012 | Smick et al. | |
| 8,257,888 B2 | 9/2012 | Sczyrba et al. | |
| 8,258,488 B2 | 9/2012 | Platzgummer et al. | |
| 8,294,117 B2 | 10/2012 | Kruit et al. | |
| 8,304,749 B2 | 11/2012 | Platzgummer et al. | |
| 8,378,320 B2 | 2/2013 | Platzgummer | |
| 8,502,174 B2 | 8/2013 | Wieland | |
| 8,531,648 B2 | 9/2013 | Jager et al. | |
| 8,546,767 B2 | 10/2013 | Platzgummer et al. | |
| 8,563,942 B2 | 10/2013 | Platzgummer | |
| 8,598,544 B2 | 12/2013 | Van De Peut et al. | |
| 8,859,983 B2 | 10/2014 | Wieland | |
| 9,053,906 B2 | 6/2015 | Platzgummer | |
| 9,093,201 B2 | 7/2015 | Platzgummer et al. | |
| 9,099,277 B2 | 8/2015 | Platzgummer | |
| 9,184,026 B2 * | 11/2015 | Wieland | H01J 37/3026 |
| 9,188,874 B1 | 11/2015 | Johnson | |
| 9,269,543 B2 | 2/2016 | Reiter et al. | |
| 9,335,638 B2 | 5/2016 | Jager et al. | |
| 9,373,482 B2 | 6/2016 | Platzgummer | |
| 9,443,699 B2 | 9/2016 | Platzgummer et al. | |
| 9,495,499 B2 | 11/2016 | Platzgummer et al. | |
| 9,520,268 B2 | 12/2016 | Platzgummer | |
| 9,568,907 B2 | 2/2017 | Platzgummer et al. | |
| 9,653,263 B2 * | 5/2017 | Platzgummer | H01J 37/3177 |
| 9,691,589 B2 * | 6/2017 | Van De Peut | B82Y 10/00 |
| 9,799,487 B2 | 10/2017 | Platzgummer | |
| 9,978,562 B2 * | 5/2018 | Van De Peut | B82Y 10/00 |
| 2001/0028038 A1 | 10/2001 | Hamaguchi et al. | |
| 2002/0021426 A1 | 2/2002 | Mei et al. | |
| 2002/0148978 A1 | 10/2002 | Innes et al. | |
| 2003/0085360 A1 * | 5/2003 | Parker | B82Y 10/00 250/396 R |
| 2003/0106230 A1 | 6/2003 | Hennessey | |
| 2003/0155534 A1 | 8/2003 | Platzgummer et al. | |
| 2003/0160980 A1 | 8/2003 | Olsson et al. | |
| 2004/0058536 A1 | 3/2004 | Ki | |
| 2004/0119021 A1 | 6/2004 | Parker et al. | |
| 2004/0157407 A1 | 8/2004 | Qin-Yi et al. | |
| 2004/0169147 A1 | 9/2004 | Ono et al. | |
| 2005/0063510 A1 | 3/2005 | Hieronimi et al. | |
| 2005/0072941 A1 | 4/2005 | Tanimoto et al. | |
| 2005/0104013 A1 | 5/2005 | Stengl et al. | |
| 2005/0242302 A1 | 11/2005 | Platzgummer et al. | |
| 2005/0242303 A1 | 11/2005 | Platzgummer | |
| 2006/0060775 A1 | 3/2006 | Sakakibara et al. | |
| 2006/0076509 A1 | 4/2006 | Okino et al. | |
| 2006/0169925 A1 | 8/2006 | Miyajima et al. | |
| 2007/0138374 A1 | 6/2007 | Nishibashi et al. | |
| 2007/0178407 A1 | 8/2007 | Hatakeyama et al. | |
| 2007/0279768 A1 | 12/2007 | Shibazaki et al. | |
| 2008/0024745 A1 | 1/2008 | Baselmans et al. | |
| 2008/0080782 A1 | 4/2008 | Olsson et al. | |
| 2008/0099693 A1 | 5/2008 | Platzgummer et al. | |
| 2008/0105827 A1 | 5/2008 | Tamamushi | |
| 2008/0128638 A1 | 6/2008 | Doering et al. | |
| 2008/0142728 A1 | 6/2008 | Smick et al. | |
| 2008/0198352 A1 | 8/2008 | Kugler et al. | |
| 2008/0203317 A1 | 8/2008 | Platzgummer et al. | |
| 2008/0212052 A1 | 9/2008 | Wagner et al. | |
| 2008/0237460 A1 | 10/2008 | Fragner et al. | |
| 2008/0257096 A1 | 10/2008 | Zhu et al. | |
| 2008/0260283 A1 | 10/2008 | Ivansen | |
| 2008/0283767 A1 | 11/2008 | Platzgummer | |
| 2008/0299490 A1 | 12/2008 | Takekoshi | |

(56) References Cited

U.S. PATENT DOCUMENTS

| | | |
|---|---|---|
| 2009/0032700 A1 | 2/2009 | Park et al. |
| 2009/0101816 A1 | 4/2009 | Noji et al. |
| 2009/0200495 A1 | 8/2009 | Platzgummer et al. |
| 2009/0256075 A1 | 10/2009 | Kemen et al. |
| 2009/0321631 A1 | 12/2009 | Smick et al. |
| 2010/0124722 A1* | 5/2010 | Fragner .......... B82Y 10/00 430/296 |
| 2010/0127185 A1 | 5/2010 | Fragner et al. |
| 2010/0127431 A1 | 5/2010 | Sandstrom |
| 2010/0178602 A1 | 7/2010 | Seto et al. |
| 2010/0187434 A1 | 7/2010 | Platzgummer et al. |
| 2010/0288938 A1 | 11/2010 | Platzgummer |
| 2011/0053087 A1 | 3/2011 | Nielsen et al. |
| 2011/0073782 A1 | 3/2011 | Wieland |
| 2011/0121208 A1 | 5/2011 | Nakayamada et al. |
| 2011/0204253 A1 | 8/2011 | Platzgummer et al. |
| 2011/0226968 A1 | 9/2011 | Platzgummer |
| 2012/0001097 A1* | 1/2012 | Yashima .......... H01J 37/3174 250/492.22 |
| 2012/0007002 A1 | 1/2012 | Nakayamada et al. |
| 2012/0076269 A1 | 3/2012 | Roberts et al. |
| 2012/0085940 A1 | 4/2012 | Matsumoto |
| 2012/0151428 A1 | 6/2012 | Tanaka et al. |
| 2012/0211674 A1 | 8/2012 | Kato |
| 2012/0286169 A1 | 11/2012 | Van de Peut et al. |
| 2012/0286170 A1* | 11/2012 | Van De Peut .......... B82Y 10/00 250/397 |
| 2012/0288787 A1 | 11/2012 | Choi et al. |
| 2012/0329289 A1 | 12/2012 | Fujimura et al. |
| 2013/0120724 A1 | 5/2013 | Wieland et al. |
| 2013/0157198 A1 | 6/2013 | Yoshikawa et al. |
| 2013/0164684 A1 | 6/2013 | Yamanaka |
| 2013/0198697 A1 | 8/2013 | Hotzel et al. |
| 2013/0201468 A1 | 8/2013 | Manakli |
| 2013/0252145 A1 | 9/2013 | Matsumoto et al. |
| 2013/0253688 A1 | 9/2013 | Matsumoto et al. |
| 2014/0042334 A1 | 2/2014 | Wieland |
| 2014/0158916 A1 | 6/2014 | Fujimura |
| 2014/0197327 A1 | 7/2014 | Platzgummer |
| 2014/0240732 A1 | 8/2014 | Tinnemans et al. |
| 2014/0264066 A1* | 9/2014 | Van De Peut .......... B82Y 10/00 250/398 |
| 2014/0264086 A1* | 9/2014 | Van De Peut .......... B82Y 10/00 250/492.22 |
| 2014/0322927 A1 | 10/2014 | Morita |
| 2014/0346369 A1 | 11/2014 | Matsumoto |
| 2015/0021493 A1 | 1/2015 | Platzgummer |
| 2015/0028230 A1 | 1/2015 | Platzgummer |
| 2015/0069260 A1 | 3/2015 | Platzgummer |
| 2015/0243480 A1 | 8/2015 | Yamada et al. |
| 2015/0248993 A1 | 9/2015 | Reiter et al. |
| 2015/0311030 A1 | 10/2015 | Platzgummer et al. |
| 2015/0311031 A1 | 10/2015 | Platzgummer et al. |
| 2015/0347660 A1 | 12/2015 | Platzgummer et al. |
| 2016/0012170 A1 | 1/2016 | Platzgummer |
| 2016/0013019 A1 | 1/2016 | Platzgummer |
| 2016/0071684 A1 | 3/2016 | Platzgummer et al. |
| 2016/0276131 A1 | 9/2016 | Platzgummer |
| 2016/0276132 A1 | 9/2016 | Platzgummer |
| 2016/0336147 A1 | 11/2016 | Platzgummer |
| 2017/0357153 A1 | 12/2017 | Platzgummer |

FOREIGN PATENT DOCUMENTS

| | | |
|---|---|---|
| EP | 1033741 A2 | 9/2000 |
| EP | 1993118 A2 | 11/2008 |
| EP | 2019415 A1 | 1/2009 |
| EP | 2187427 A2 | 5/2010 |
| EP | 2214194 A1 | 8/2010 |
| EP | 2317535 A2 | 5/2011 |
| EP | 2363875 A1 | 9/2011 |
| EP | 2950325 A1 | 12/2015 |
| EP | 2993684 A1 | 3/2016 |
| EP | 3037878 A1 | 6/2016 |
| GB | 2349737 A | 11/2000 |
| JP | 08213301 A | 8/1996 |
| JP | 2006019436 A | 1/2006 |
| JP | 2006332289 | 12/2006 |
| WO | 2006084298 A1 | 8/2006 |
| WO | 2008053140 A1 | 5/2008 |
| WO | 2009147202 | 12/2009 |
| WO | 2012172913 A1 | 12/2012 |

OTHER PUBLICATIONS

Palfrader et al., "Computing Mitered Offset Curves Based on Straight Skeletons", Computer-Aided Design & Applications, vol. 12, No. 4, Feb. 11, 2015, pp. 414-424.

Paraskevopoulos et al., "Scalable (24-140 Gbps) optical data link, well adapted for future maskless lithography applications", Proc. SPIE vol. 7271, 72711 I, 2009, 11 pgs.

Platzgummer et al., "eMET—50keV electron Mask Exposure Tool Development based on proven multi-beam projection technology", Proc. of SPIE, 2010, vol. 7823, pp. 782308-1-782308-12.

Platzgummer et al., "eMET POC: Realization of a proof-of-concept 50 keV electron multibeam Mask Exposure Tool", Proc. of SPIE, 2011, vol. 8166, pp. 816622-1-816622-7.

Shih, "Image processing and mathematical morphology: fundamentals and applications", CRC Press, 2009, pp. 26-32.

Vink et al., "Materials with a high secondary-electron yield for use in plasma displays", Applied Physics Letters, Mar. 25, 2002, vol. 80, No. 12, pp. 2216-2218.

Wheeler et al., "Use of Electron Beams in VLSI", G.E.C.Journal of Science and Technology, General Electric Company. Wembley, Middlesex, GB, vol. 48, No. 2, Jan. 1, 1982, pp. 103-107, XP000820522.

Zhang et al., "Integrated Multi-Electron-Beam Blanker Array for Sub-10-nm Electron Beam Induced Deposition", J. Vac. Sci. Technol., Nov./Dec. 2006, vol. B24, No. 6, pp. 2857-2860.

European Search Report for Application 08450077.6, report dated Jan. 29, 2010, 2 pgs.

European Search Report for Application 09450211.9-1226; report dated Sep. 14, 2010; 4 pgs.

European Search Report for application 09450212.7; dated Sep. 28, 2010, 9 pgs.

European Search Report for Application 141501197.7, report dated Jun. 6, 2014, 2 pgs.

European Search Report for Application 14165967, report dated Oct. 30, 2014, 2 pgs.

European Search Report for Application 14165970, report dated Jun. 18, 2014, 2 pgs.

European Search Report for Application 14170611, report dated Nov. 4, 2014, 3 pgs.

European Search Report for Application 14176563, report dated Jan. 14, 2015, 2 pgs.

European Search Report for Application 14177851; report dated Oct. 16, 2014; 1 page.

European Search Report for Application 14199183, report dated Jun. 19, 2015, 2 pgs.

European Search Report for Application 15159397.7, report dated Sep. 28, 2015, 7 pgs.

European Search Report for Application 15159617.8, report dated Oct. 19, 2015, 3 pgs.

European Search Report for Application 15164770, report dated Sep. 18, 2015; 2 pgs.

European Search Report for Application 15164772, report dated Sep. 11, 2015, 2 pgs.

European Search Report for Application 15169632, report dated Oct. 20, 2015, 3 pgs.

European Search Report for Application 15171348, report dated Oct. 30, 2015, 2 pgs.

European Search Report for EP 14176645, completed Dec. 1, 2014, 1 pg.

European Search Report for EP Application No. 16174185, Search Completed Dec. 6, 2016, 2 pgs.

European Search Report for European Application 10450070.7 dated May 7, 2012, 13 pgs.

(56) References Cited

OTHER PUBLICATIONS

European Search Report for European Application No. 16160622, Search completed Jul. 21, 2016, dated Jul. 21, 2016, 3 pgs.
European Search Report for European Patent Application 16160621, Report Completed Oct. 5, 2016, 3 pgs.
Extended European Search Report for European Application No. 16169216.5, Search completed Sep. 21, 2016, dated Sep. 29, 2016, 12 Pgs.
Extended European Search Report for European Application No. 17153506, Search completed Oct. 5, 2017, dated Oct. 16, 2017, 2 Pgs.
"Dither", Wkipedia, Retrieved from https://en.wikipedia.org/w/index.php?title=Dither&oldid=762118152 on Oct. 5, 2017.
"Ordered dithering", Wikipedia, Retrieved from https://en.wikipedia.org/w/index.php?title=Ordered_dithering&oldid=759840417 on Oct. 5, 2017.
Berry et al., "Programmable aperture plate for maskless high-throughput nanolithography", J. Vac. Sci. Technol., Nov./Dec. 1997, vol. B15, No. 6, pp. 2382-2386.
Borodovsky, "EUV, EBDW—ARF Replacement or Extension?", KLA-Tencor Lithography User Forum, Feb. 21, 2010, San Jose, CA, USA, 21 pgs.
Borodovsky, "MPProcessing for MPProcessors", SEMATECH Maskless Lithography and Multibeam Mask Writer Workshop, May 10, 2010, New York, NY, USA, 35 pgs.
Disclosed Anonymously, "Multi-tone rasterization, dual pass scan, data path and cell based vector format", IPCOM000183472D, printed from ip.com PriorArtDatabase, published May 22, 2009, 108 pages.
Hinterberger, "Ion optics with electrostatic lenses", University of Bonn, Germany, 2006, 18 pgs.
Huber et al., "Computing Straight Skeletons and Motorcycle Graphs: Theory and Practice", Thesis, Univ. of Salzburg (Austria) Jun. 2011, 134 pgs.
Kapl et al., "Characterization of CMOS programmable multi-beam blanking arrays as used for programmable multi-beam projection lithography and resistless nanopatterning", Journal of Micromechanics and Microengineering, vol. 21, Mar. 24, 2011, pp. 1-8.
Kim et al., "Binary-encounter-dipole model for electron-impact ionization", Phys. Rev. A 50, 3954 (1994).
Extended European Search Report for European Application No. 17187922.4, Search completed Feb. 21, 2018, dated Mar. 6, 2018, 7pgs.
Extended European Search Report for European Application No. 17191553.1, Search completed Mar. 22, 2018, dated Apr. 9, 2018, 5pgs.

* cited by examiner

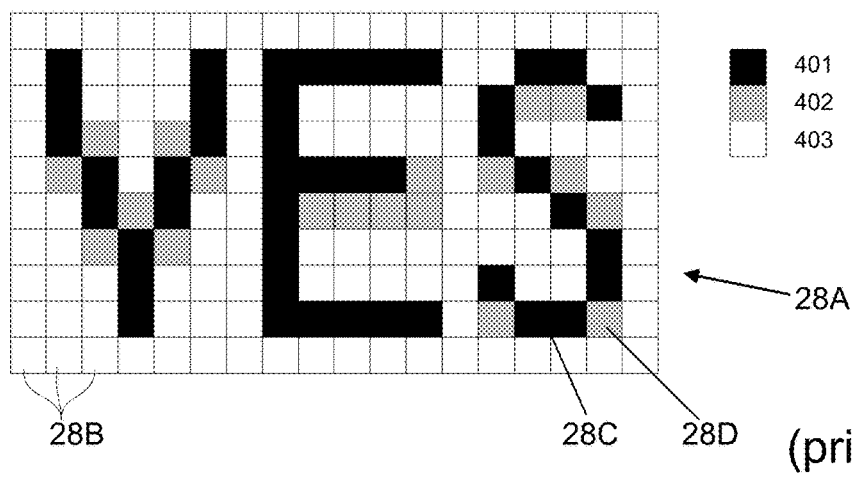
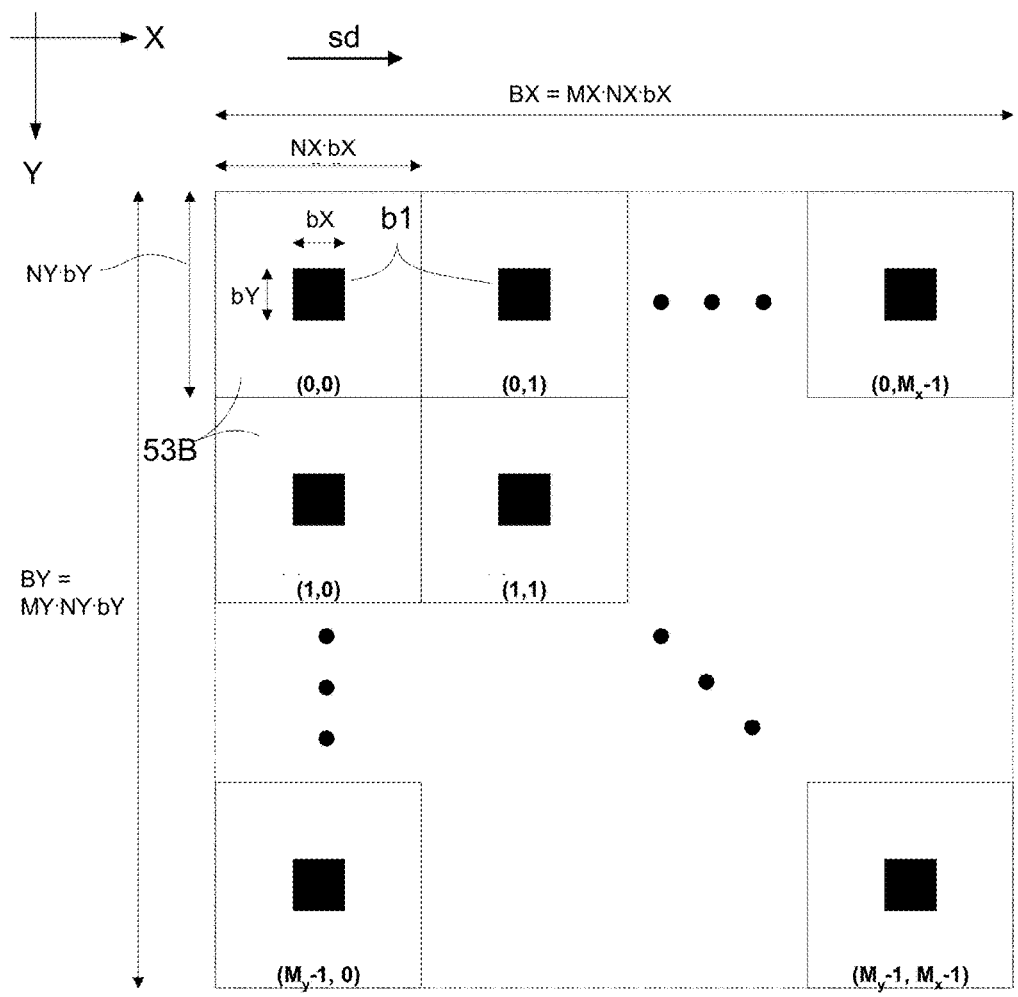
Fig. 4 (prior art)
Fig. 5 (prior art)

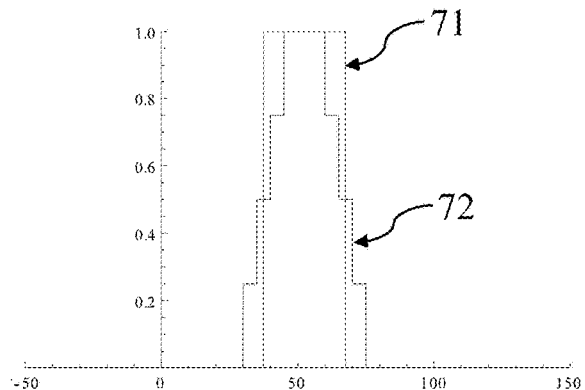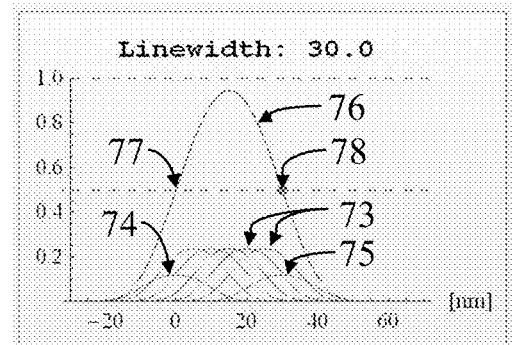
Fig. 9A  Fig. 9B
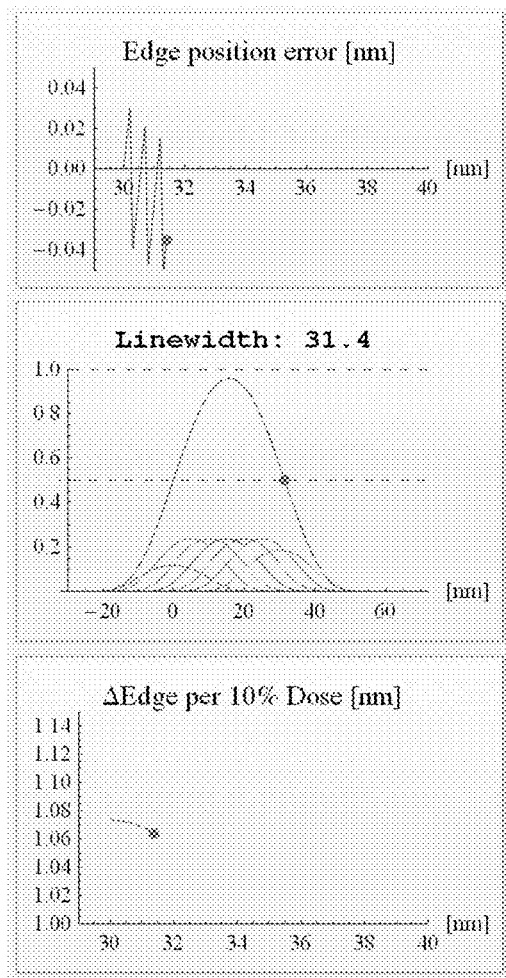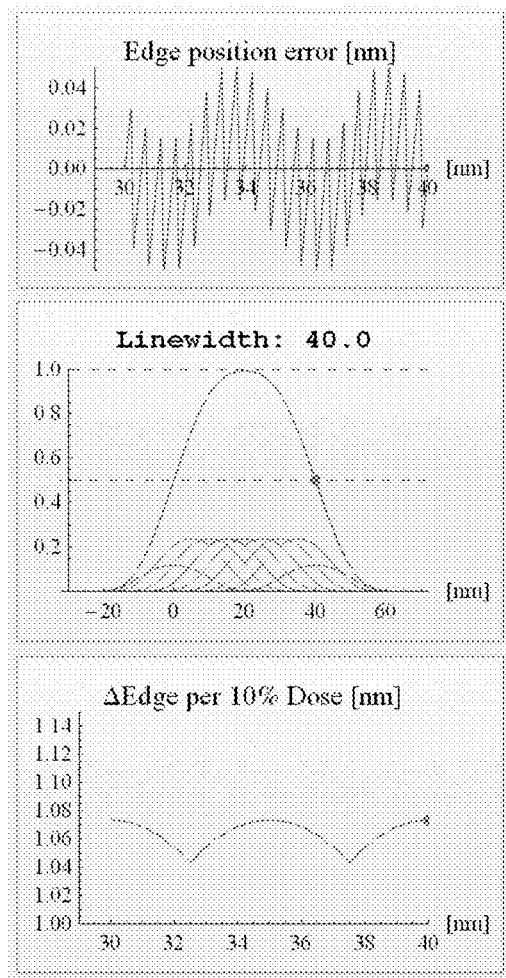
Fig. 9C  Fig. 9D

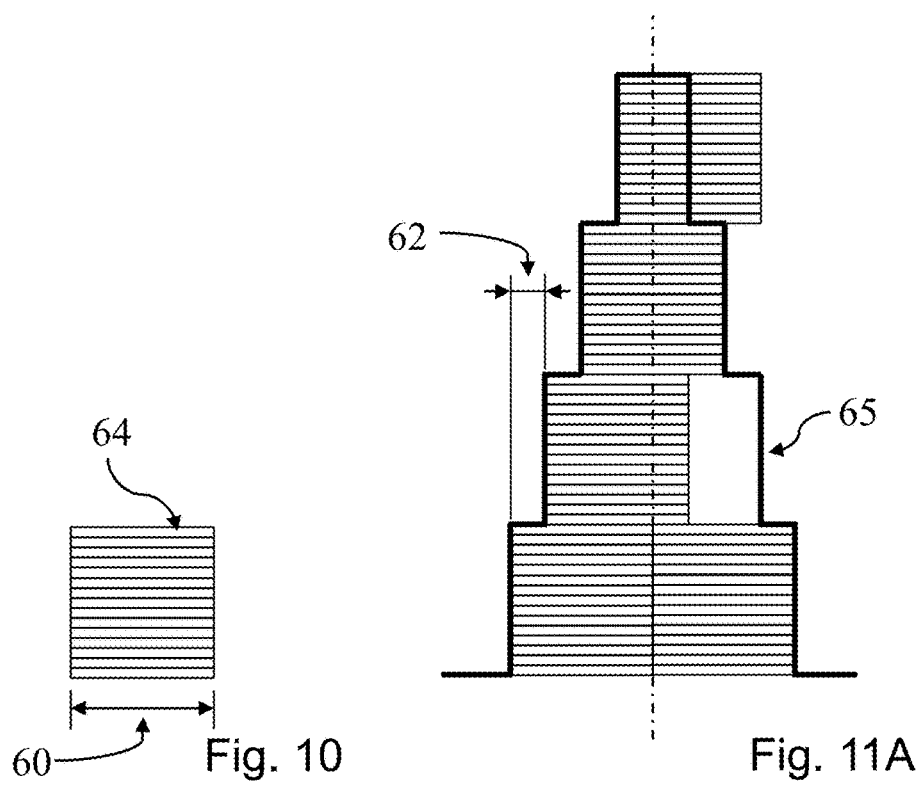
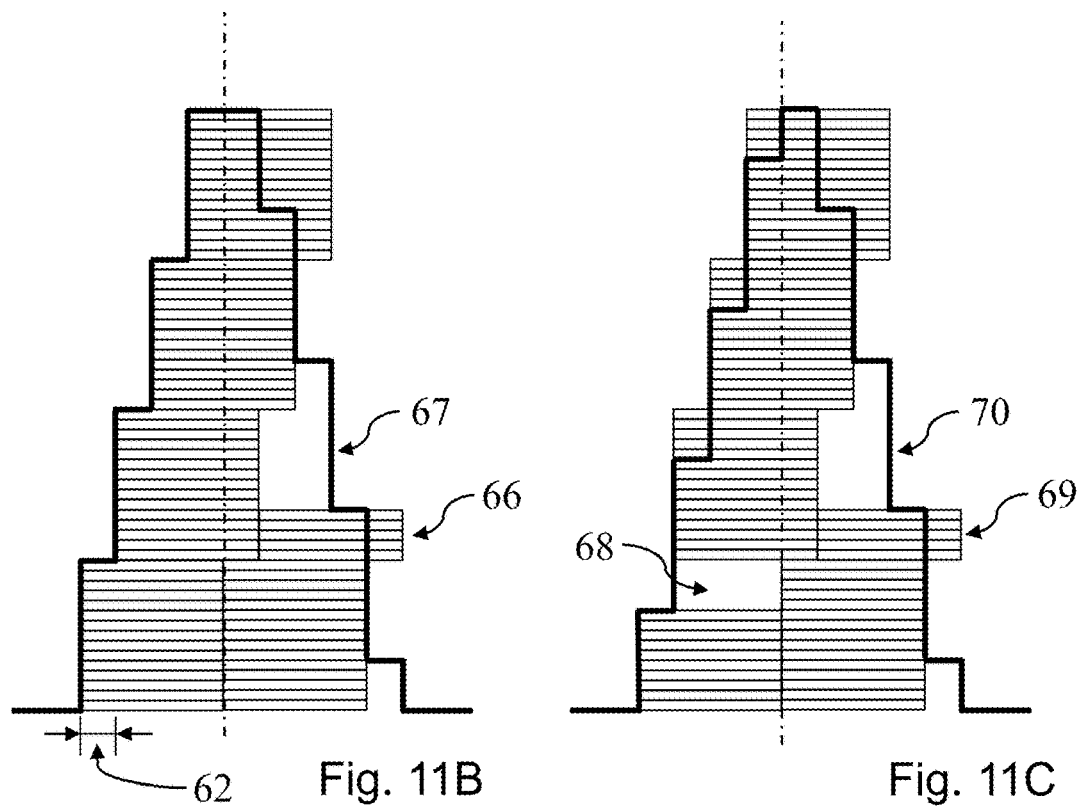

cfg1　　　　cfg2　　　　cfg3　　　　cfg4　　　　cfg5

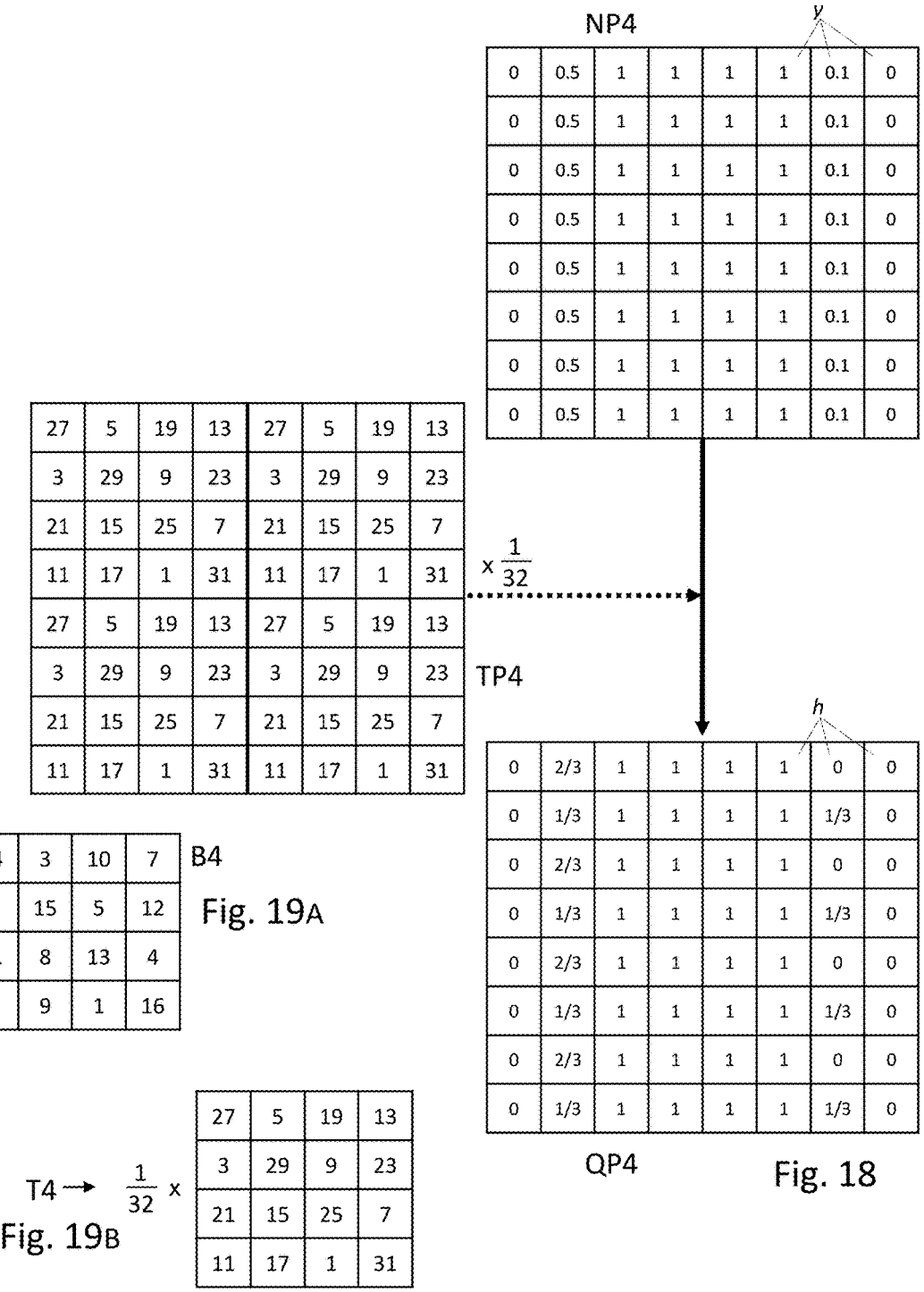

NP20

| 7.125 | 7.125 |
|---|---|
| 15 | 15 |

$\frac{1}{15} \times$ 44.25/60

DF22

| 1 | 0.930 |
|---|---|
| 0.992 | 0.958 |

DP22

| 7.125 | 6.625 |
|---|---|
| 14.875 | 14.375 |

$\frac{1}{15} \times$ 43/60

NQ22

| 8 | 7 |
|---|---|
| 15 | 15 |

45/60 $\times \frac{1}{15}$

| 7.125 | 7.125 |
|---|---|
| 15 | 15 |

$\frac{1}{15} \times$ 44.25/60

DF23

| 0.972 | 0.972 |
|---|---|
| 0.972 | 0.972 |

DP23

| 6.926 | 6.926 |
|---|---|
| 14.580 | 14.580 |

$\frac{1}{15} \times$ 43/60

NQ23

| 7 | 7 |
|---|---|
| 14 | 15 |

43/60 $\times \frac{1}{15}$

$\frac{1}{15} \times$ 
| 15 | 15 |
|---|---|
| 40/60 ||
| 5 | 5 |

DF24

| 0.875 | 0.975 |
|---|---|
| 0.975 | 0.875 |

DP24

$\frac{1}{15} \times$ 
| 13.125 | 14.625 |
|---|---|
| 37/60 ||
| 4.875 | 4.375 |

QP24

| 14 | 15 |
|---|---|
| 39/60 ||
| 5 | 5 |
$\times \frac{1}{15}$

$\frac{1}{15} \times$ 
| 15 | 15 |
|---|---|
| 40/60 ||
| 5 | 5 |

DF25

| 0.925 | 0.925 |
|---|---|
| 0.925 | 0.925 |

DP25

$\frac{1}{15} \times$ 
| 13.875 | 13.875 |
|---|---|
| 37/60 ||
| 4.625 | 4.625 |

QP25

| 14 | 14 |
|---|---|
| 37/60 ||
| 4 | 5 |
$\times \frac{1}{15}$

Fig. 25

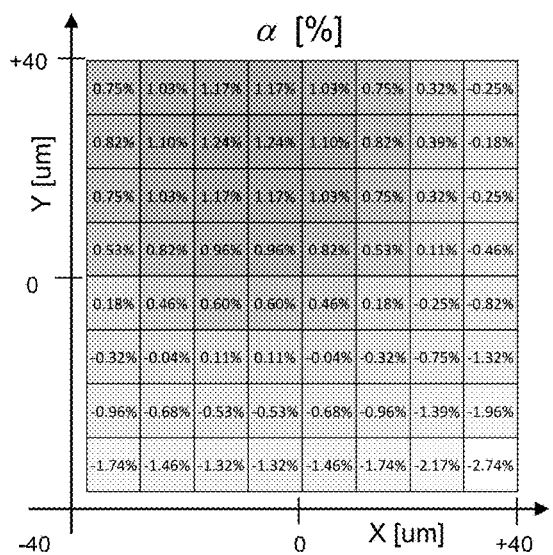 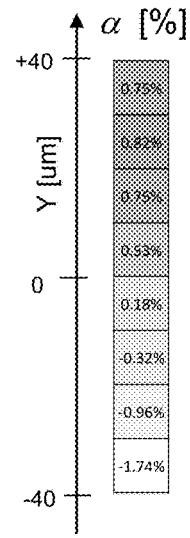
Fig. 27A    Fig. 27B
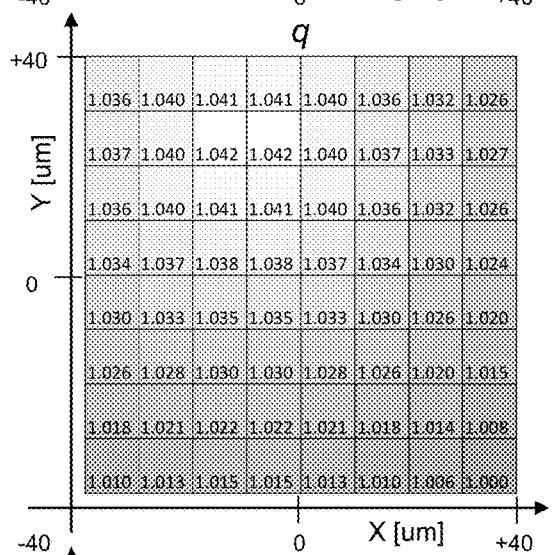 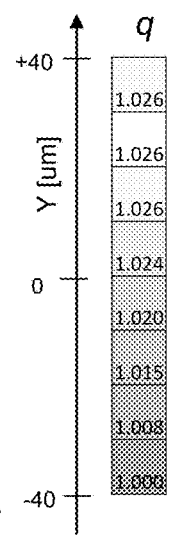
Fig. 28A    Fig. 28B
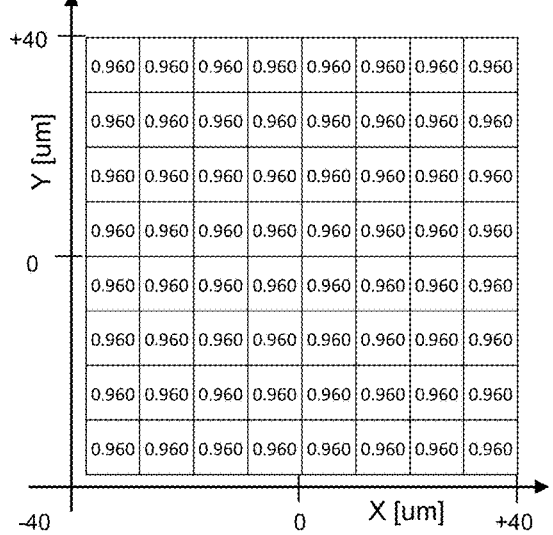 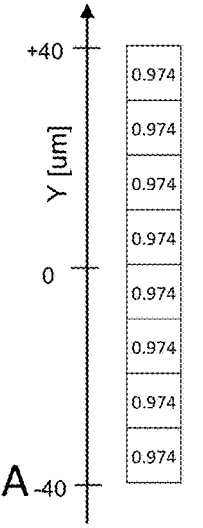
Fig. 29A    Fig. 29B

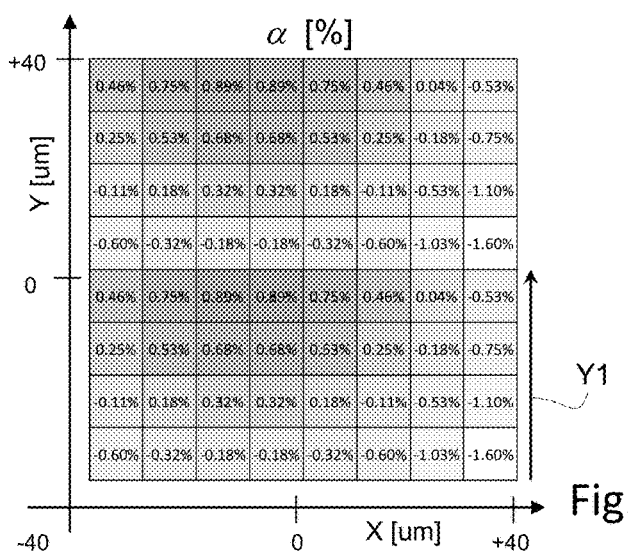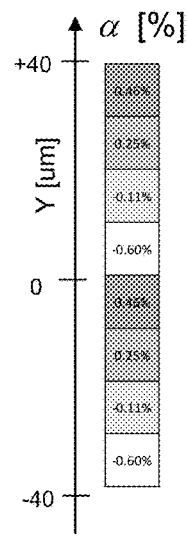
Fig. 30A    Fig. 30B
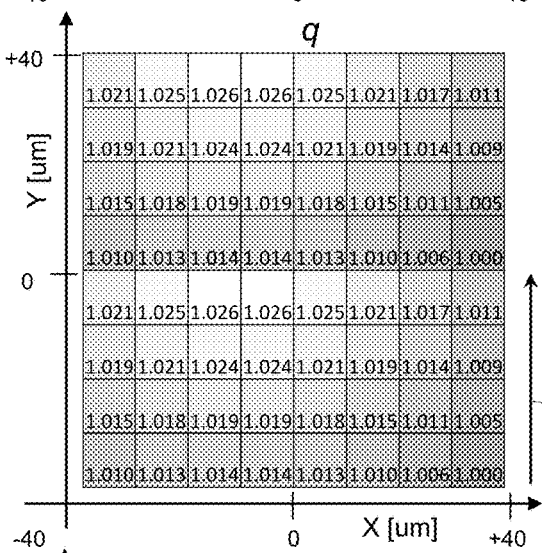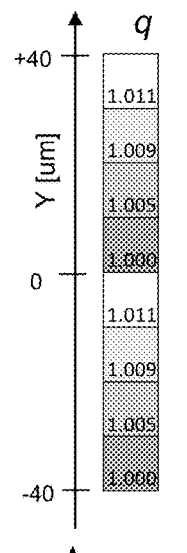
Fig. 31A    Fig. 31B
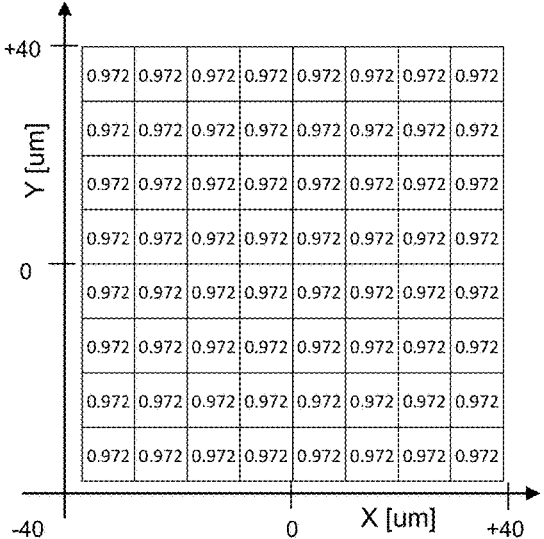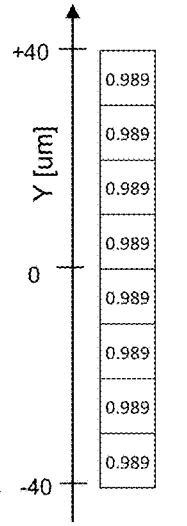
Fig. 32A    Fig. 32B

US 10,325,757 B2

ADVANCED DOSE-LEVEL QUANTIZATION OF MULTIBEAM-WRITERS

RELATED APPLICATION

This application claims priority to U.S. provisional patent application Ser. No. 62/451,528 entitled "Advanced Dose-Level Quantization for Multibeam-Writers" filed on Jan. 27, 2017, which is incorporated herein by reference.

FIELD OF THE INVENTION

The invention generally relates to methods and apparatuses for generating a desired pattern on a specified target by irradiating a target with a beam of energetic radiation formed by electrically charged particles.

BACKGROUND OF THE INVENTION

The use of charged particle beams in the field of generating desired patterns such as for example those found on printed circuit boards is well known. One common technique for generating such patterns uses a Multibeam-Writer (MBW) which projects a charged particle beam through a series of apertures onto a desired surface. Such devices typically employ charged-particle optics systems, Pattern Definition (PD) devices, and a variety of methods for creating the ultimate pattern on the desired target surface.

In typical MBW systems the charged particle beam is moved along a predetermined path with respect to a target area, upon which a desired image is thereby created.

BRIEF SUMMARY OF THE INVENTION

Systems and methods in accordance with various embodiments of the invention provide a multibeam-writing system which projects a charged particle beam through a series of apertures onto a target area and methods for improving the clarity of the final desired pattern. In a number of embodiments the methods providing a pattern definition device having a plurality of apertures transparent to a source of radiation, and directing an illuminating wide beam through the apertures of the pattern definition device to form a patterned beam consisting of a corresponding plurality of beamlets, and illuminating a target with the patterned beam during a sequence of exposure intervals to form a pattern image on the target, wherein the pattern image further comprises a plurality of pattern pixels located on the target wherein the plurality of pattern pixels correspond to at least a portion of the plurality of apertures, and wherein during the sequence of exposure intervals, the at least a portion of the plurality of apertures are selectively controlled such that the plurality of pattern pixels are exposed to a respective dose amount in accordance with the desired pattern, generating a relative movement between the target and the pattern definition device to produce a stepwise movement of the pattern image on the target along a path over an exposure region, said path comprising a plurality sections which extend along a scanning direction, wherein the plurality of sections correspond to a plurality of exposure stripes that collectively cover the entirety of said exposure region over sequential exposures, wherein the exposure stripes are mutually overlapping and offset from each other in a direction transverse to the scanning direction, such that exposure region is exposed by at least two different exposure stripes at different transversal offsets, and calculating, for each pixel, a corrected dose amount by dividing the value of the nominal dose amount by a correction factor, wherein the same correction factor is used with pixels written by beamlets located at positions which differ only by said transversal offsets of overlapping stripes.

In other embodiments the method further provides that wherein during the step of calculating a corrected dose amount for each pixel, an available current density at the respective pixel is determined, wherein said maximum available current density is determined as the actual current density of the irradiating beam radiated through the aperture corresponding to the respective pixel, said correction factor of the respective pixel is calculated as the ratio of said available current density to the minimum current density across the overall beam array field, and correction factors are averaged among those pixels that are located at positions which differ only by said transversal offsets of overlapping stripes.

In yet other embodiments the further provides multiplicative renormalization of the correction factors, using a renormalizing factor chosen such that one of the largest value and the smallest value of the correction factors is renormalized to 1.

In still other embodiments the method provides that step of calculating a corrected dose amount for each pixel comprises calculating, for each pixel in a row of pixels parallel to the scanning direction within a respective exposure stripe, corrected dose amounts by dividing the values of the dose amounts by a row correction factor, wherein said row correction factor is uniformly applied to all pixels of a row of pixels.

In yet still other embodiments the method provides that said row correction factor is calculated for a respective row of pixels based on the values of current dose actually radiated through a series of apertures, said series of apertures containing all apertures within the pattern definition device which impart dose amounts to the respective row of pixels, wherein the row correction factor of a row of pixels is calculated as the ratio of actual current dose of an aperture, as averaged over the corresponding series of apertures, to a nominal current dose value assumed to be constant over the plurality of apertures of the pattern definition device.

In even other embodiments the method provides that said region where a beam exposure is to be performed is composed of a plurality of pattern pixels arranged in a regular arrangement, said region having a total width as measured across said scanning direction, said exposure stripes within said region running substantially parallel to each other along said scanning direction and having uniform widths as measured across said scanning direction.

In other embodiments the method provides that the exposure stripes are mutually overlapping, the position of the stripes differing by a transversal offset in a direction across the scanning direction, wherein the row correction factors of rows of pixels are averaged over those rows of pixels which are offset to each other by said transversal offset.

In still other embodiments the method provides that the correction factor varies between groups of pixels where said groups of pixels differ by an offset which does not correspond to a transversal offset of overlapping stripes.

In yet other embodiments the method further provides computing an exposure pattern suitable for exposing the desired pattern on a target using said pattern definition device for writing said desired pattern by exposing a multitude of pixels within said region on the target, wherein during exposing the desired pattern on a target: in said pattern definition device said plurality of blanking apertures is arranged in a predetermined arrangement defining mutual positions of the blanking apertures, each blanking aperture being selectively adjustable with regard to a dose value to be exposed through the respective blanking aperture onto a corresponding aperture image on the target during a respective exposure interval, said dose value taking a respective value in accordance with a discrete palette, said discrete palette including a number of gray values forming a scale ranging from a minimum value to a maximum value, during a writing process of said desired pattern, a sequence of exposure intervals is made, wherein in each exposure interval the blanking apertures are imaged onto the target, thus generating a corresponding plurality of aperture images, wherein the position of aperture images is kept fixed relative to the target at the position of a pixel during an exposure interval, but between exposure intervals the position of aperture images is shifted over the target, thus exposing the multitude of pixels on the target, and the aperture images are mutually overlapping on the target, and the aperture images have a nominal width which is greater than the distance between pixel positions of neighboring aperture images on the target, by an oversampling factor greater than one, wherein computing the exposure pattern comprises: determining the discrete palette, providing the desired pattern and calculating a nominal exposure pattern as a raster graphics defined on the multitude of pixel elements, said nominal exposure pattern being suitable to create a nominal dose distribution on the target realizing contour lines of the desired pattern and including for each pixel element a respective nominal dose value, and determining, for each pixel element, a discrete value which approximates the nominal dose value of the respective pixel element, said discrete value being selected from the discrete palette, wherein determining the discrete values includes employing ordered dithering using a dither matrix of a predefined size.

In yet still other embodiments the method provides that the dither matrix is a Bayer matrix.

In even other embodiments a pattern definition device is provided comprising: a plurality of apertures transparent to a source of radiation, a data processing unit having at least one input terminal and in communication with the plurality of apertures transparent to a source of radiation wherein the data processing unit is configured to receive a set of instructions defining a desired pattern image to be exposed on a target area, wherein at least a portion of the plurality of apertures correspond to a plurality of pattern image pixels on the target area and the at least a portion of the plurality of apertures are configured to expose the pattern image pixels to a respective dose amount in accordance with the desired pattern image, and wherein the data processing is further configured to calculate a correction needed for each of the pattern image pixels to correct for a pattern beam overlap by dividing a value of the nominal dose amount by a correction factor dose, and wherein the data processing unit is further configured to communicate the correction dose to the plurality of apertures.

BRIEF DESCRIPTION OF THE DRAWINGS

The description will be more fully understood with reference to the following figures, which are presented as exemplary embodiments of the invention and should not be construed as a complete recitation of the scope of the invention, wherein:

FIG. 4 Illustrates an example of a pixel map of an exemplary pattern to be exposed in accordance with prior art teachings.

FIG. 5 Illustrates an arrangement of apertures as imaged onto a target in accordance with prior art teachings.

FIG. 9A illustrates an intensity profile and a dose level in accordance with various embodiments.

FIG. 9B illustrates another view of an intensity profile in accordance with various embodiments.

FIGS. 9C and 9D illustrate MBW intensity profiles and related data as obtained for a simulation of a line in accordance with many embodiments.

FIG. 10 illustrates an intensity profile generated by exposure of a single exposure spot in accordance with many embodiments FIG. 11A illustrates an intensity profile generated from the exposure of a line of a determined width.

FIGS. 11B and 11C illustrate the fine adjustment of the position of one edge (FIG. 11B) or both edges (FIG. 11C) of the line of FIG. 11A via suitable modifications of the dose levels corresponding the exposure spots.

FIG. 18 illustrates an embodiment of dithering with o=4.

FIG. 19A illustrates the index matrix used in the dithering matrix in accordance with FIG. 18.

FIG. 19B illustrates the threshold matrix used in the dithering matrix in accordance with FIG. 18

FIG. 22 illustrates an exemplary embodiment of the dithering process further illustrating a correction of beam current inhomogeneity.

FIG. 23 illustrates an exemplary embodiment further illustrating a correction of beam current inhomogeneity which is uniform along the scanning direction.

FIGS. 24 and 25 illustrate other exemplary embodiments of dithering in accordance with the invention.

FIG. 27A shows an exemplary embodiment of a typical current profile across an image field.

FIG. 27B shows the current profile of FIG. 27A averaged along the X-direction

FIG. 28A shows correction dose factors for the current profile of FIG. 27A

FIG. 28B shows correction dose factors for a uniform correction, i.e. uniform along the X-direction.

FIG. 29A shows the corrected dose profile as obtained from FIGS. 27A and 28A.

FIG. 29B shows the corrected dose profile as obtained from FIGS. 27B and 28B.

FIGS. 30A to 32B show current profiles, correction dose factors and corrected dose profiles in a manner analogous to FIGS. 27A to 29B, respectively, in accordance with various embodiments of the invention.

DETAILED DESCRIPTION

Figure 1:
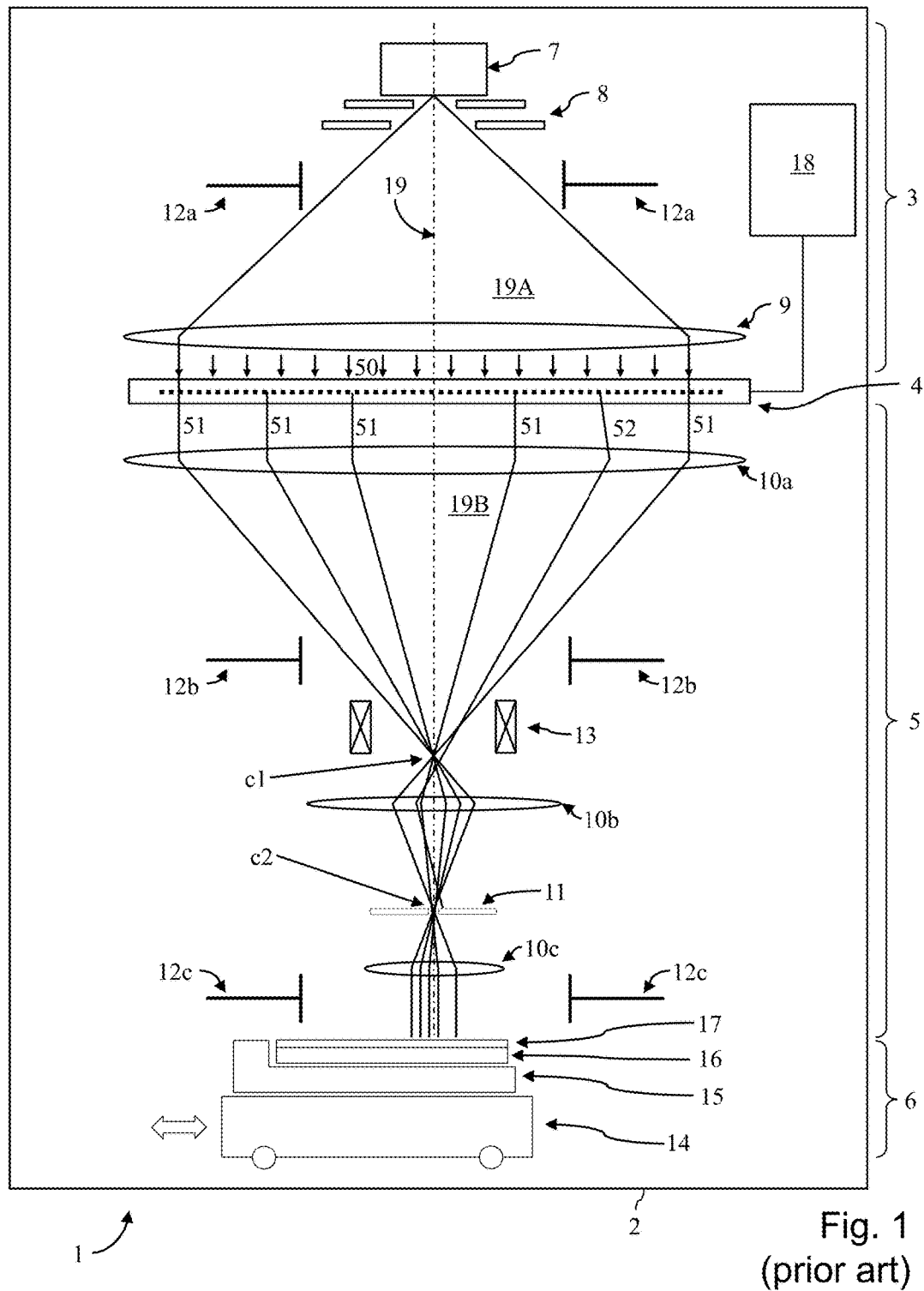
FIG. 1 illustrates an MBW system according to the state of the art in a longitudinal sectional view.

Turning now to the description and drawings, methods and apparatus for improving a multibeam-writing systems are provided. In many embodiments of a multibeam-writer, a charged-particle beam is directed onto a desired target area as the beam device moves in relation to the target area. In such embodiments, a desired pattern is translated onto the target as the charged particle beam passes through a series of imaging apertures and/or subsequent lenses and deflectors that direct the beam onto the target in the desired positions (i.e. pixel locations) as the device is moved over the target area. In various embodiments exposure stripes are formed over the region to be exposed as the device moves; creating mutually overlapping exposure areas from each subsequent pass. In embodiments, at each desired pixel location correction factors are applied to account for image blurring from the exposure stripe overlap.

A typical implementation of a Multibeam-Writer (MBW) utilizes a 50 keV electron writer tool resulting in a total beam size of 20 nm which comprises a 512×512 grid of 262,144 total programmable beamlets within a beam array field of 81.92 µm×81.92 µm at the target area. An MBW of this type typically utilizes a 152.4 mm×152.4 mm substrate that is approximately 6.35 mm thick. The substrate is typically covered in an electron beam sensitive resist.

Beam size can be reduced from the typical 20 nm to 10 nm through a variety of changes. Reducing the beam size from 20 to 10 nm can typically be achieved by using a different aperture array plate (AAP), with 2 µm×2 µm opening size of the apertures instead of 4 µm×4 µm opening size. As outlined in U.S. Pat. No. 8,546,767, whose disclosure is incorporated herein by reference, a change of the beam size may also be realized in-situ by spatial adjustment of the AAP having multiple aperture arrays of different geometric parameters, such a total size, aperture spacing, aperture shapes etc.

Even with the reduction of beam size typical overlapping and column blur can occur. For example, a 10 nm beam size and a substrate with a current density of 4 A/cm$^2$, would produce a maximum individual beamlet current of 1.05 µA for each of the 262,144 programmable beamlets; if all beamlets were activated. This example would still produce a 1 sigma blur of the column.

First generation MBW production machines use 20 nm and 10 nm beams providing up to approximately 1 µA current for all 262,144 programmable beamlets. New MBW production machines use even smaller beam size. In some cases, an 8 nm beam size would provide a 640×640 array with 409,600 beamlets within the 81.92 µm×81.92 µm beam array field at the substrate. Keeping the maximum current density at 4 A/cm$^2$ will ensure that the maximum current (with all beamlets "on") is 1.05 µA. In other cases, a 5 nm beam size would provide a 1024×1024 array equaling 1,048,576 programmable beamlets at the substrate; again, at a maximum current density of 4 A/cm$^2$ the maximum current (with all beamlets "on") is 1.05 µA.

In many applications the MBW performance becomes increasingly more demanding as the Critical Dimension requirements become increasingly smaller for example at the nanometer level. In some applications Local Critical Dimension Uniformity (LCDU) and Global Critical Dimension Uniformity (GCDU) are required to be within a 3 sigma or 6 sigma variation at the nanometer level over the entire MBW writing field.

Therefore, it is desirable to finely-adjust the line edge position by means of a specifically adapted exposure dose profile. Such a fine-adjustment should not only be adaptable within the MBW beam array field (local) but also over the whole MBMW writing field on a substrate (global). However, in order to fulfill the very demanding MBW specifications of very low LCDU and GCDU values, there is the need for additional fine corrections. Here, the terms "local" and "global" refer again to small fields (e.g. the area of the MBW beam array field) and the whole MBW writing field on a substrate, respectively.

In addition to the blurring and clarity issues the use of MBWs often involves the use of exposure stripes for which an effect called "substripes" typically occurs which can affect the overall clarity of the projected image. Essentially the beamlets may be affected by imperfections arising from spatial variations in the current density within the beam illuminating the Aperture Array Plate (AAP). Additionally, imperfections in the AAP may contribute to the substripes. Consequently, there is a need to allow for crisper line creation and the reduction of substripes.

Such clarity issues as previously discussed may be corrected in accordance with the various embodiments described herein.

According to an exemplary embodiment of the invention, it is possible to correct the "substripe" effect by applying a correction factor to the nominal dose amounts at the pixels, where the presence of overlapping stripes is taken into account by averaging of the correction factors. More specifically where the exposure stripes mutually overlap in the transverse direction to the scanning direction the corrected dose factor can be calculated. The desired image pattern will produce a number of image pixels that correspond to a variety of apertures. The pixels required the corrected dose amount calculated based on the substripe overlap wherein the corrected dose for each pixel is calculated by dividing the value of the nominal dose by a correction factor for each pixel. The same correction factor may be used for pixels that have equivalent positions with respect to the mutually overlapping substripes. Otherwise the correction factor may, in general, vary, in particular between pixels (or groups of pixels) which do not have equivalent positions.

In accordance with one embodiment of the invention, the correction factors are calculated to correct variations of the current density within the irradiating beam. Thus, during the step of calculating a corrected dose amount for each pixel, the following steps may be performed:

an available current density at the respective pixel is determined, wherein said available current density is determined as the actual current density of the irradiating beam radiated through the aperture corresponding to the respective pixel;

the correction factor of the respective pixel is calculated as the ratio of said available current density to the minimum current density across the overall beam array field; and an averaging of correction factors is made within respective sets of pixels, namely by averaging the correction factors among those pixels that are located at positions which differ with respect to the transversal offsets of overlapping stripes.

Optionally, a multiplicative renormalization of the correction factors, in particular the averaged correction factors, may be added, for instance such that the largest or, preferably, the smallest (averaged) correction factor is set to 1.

A further development of this method extends the range of averaging to an entire row of pixels. Thus, in this case the step of calculating a corrected dose amount for each pixel would comprise calculating, for each pixel in a row of pixels parallel to the scanning direction within a respective exposure stripe, corrected dose amounts by dividing the values of the dose amounts by a row correction factor, wherein said row correction factor is uniformly applied to all pixels of a row of pixels. Additionally, the row correction factor may be calculated for a respective row of pixels based on the values of current dose actually radiated through a series of apertures. Such a series of apertures may contain all apertures within the pattern definition device which impart dose amounts to the respective row of pixels. The row correction factor of a row of pixels is calculated as the ratio of actual current dose of an aperture averaged over the corresponding series of apertures, where a nominal current dose value assumed to be constant over the plurality of apertures of the pattern definition device.

Another embodiment of the invention may be directed to the region where a beam exposure is to be performed. Such embodiment may comprise of a plurality of pattern pixels arranged in a regular arrangement, said region having a total width as measured across said scanning direction. Additionally, the exposure stripes within said region will run substantially parallel to each other along said scanning direction and have uniform widths as measured across the scanning direction. A typical implementation of this embodiment may provide that exposure stripes are mutually overlapping, the position of the stripes differing by a transversal offset in a direction across the scanning direction; in this case it may be suitable to average row correction factors of rows of pixels over those rows of pixels which are offset to each other by said transversal offset.

Another exemplary embodiment, which further improves avoiding the "substripe" effect and similar rasterizing effects, relates to computing an exposure pattern which is suitable for exposing a desired pattern on a target in a charged-particle lithography apparatus as mentioned above. During the exposure of the desired pattern on the target, a particle beam is directed to and illuminates a pattern definition device comprising an aperture array composed of a plurality of blanking apertures through which said particle beam penetrates for writing said desired pattern by exposing a multitude of pixels within a region (region of exposure) on the target. In the pattern definition device, the plurality of blanking apertures are arranged in a predetermined arrangement defining mutual positions of the blanking apertures. Each of the various apertures selectively adjustable with regard to a dose value to be exposed through the respective blanking aperture onto a corresponding aperture image on the target during a respective exposure interval. The dose value is a respective value in accordance with a discrete palette, where the palette includes a number of gray values forming a scale ranging from a minimum value to a maximum value. During a writing process of the desired pattern, a sequence of exposure intervals is made, wherein in each exposure interval the blanking apertures are imaged onto the target, thus generating a corresponding plurality of aperture images. The position of aperture images is thereby kept fixed relative to the target at the position of a pixel during an exposure interval. However, between exposure intervals the position of aperture images is shifted over the target, thus exposing the multitude of pixels on the target; and the aperture images are mutually overlapping on the target. The nominal width of the aperture image is typically greater than the distance between pixel positions of neighboring aperture images on the target, by an oversampling factor greater than one. In this context, according to the various embodiments, computing the exposure pattern comprises:

(i) determining the discrete palette, (ii) providing the desired pattern and calculating a nominal exposure pattern as a raster graphics defined on the multitude of pixel elements, said nominal exposure pattern being suitable to create a nominal dose distribution on the target realizing contour lines of the desired pattern and including for each pixel element a respective nominal dose value, and (iii) determining, for each pixel element, a discrete value (h) which approximates the nominal dose value of the respective pixel element, said discrete value being selected from the discrete palette, wherein in step (iii), determining the discrete values includes employing ordered dithering using a dither matrix, for instance a Bayer matrix, of a predefined size.

Compared to other dithering methods, ordered dithering has several advantages in context of a charged particle multibeam writer. Firstly, it is computationally inexpensive which is highly important for a fast (i.e. real-time) data processing in the datapath. Secondly, it is a deterministic procedure, which means that its results are uniquely reproducible. Thirdly, the ordered dithering matrix can be chosen (i.e. optimized) in a way such that line edge placement and line edge roughness in specific directions becomes optimal. This is particularly useful since the layout of semi-conductor devices mainly have two preferred (orthogonal) axes, i.e. usually horizontal and vertical lines are more important and dominant as compared to lines in arbitrary direction.

Further details of the aforementioned embodiments of a novel dose-level quantization method for pixel data, as part of the on-line data path of a lithographic charged particle multibeam exposure tool are discussed in the subsequent sections.

Various aspects of the multibeam exposure tool are further discussed in U.S. Pat. Nos. 6,768,125 and 7,781,748, whose disclosures are incorporated herein by reference.

Lithographic Apparatus

Figure 2:
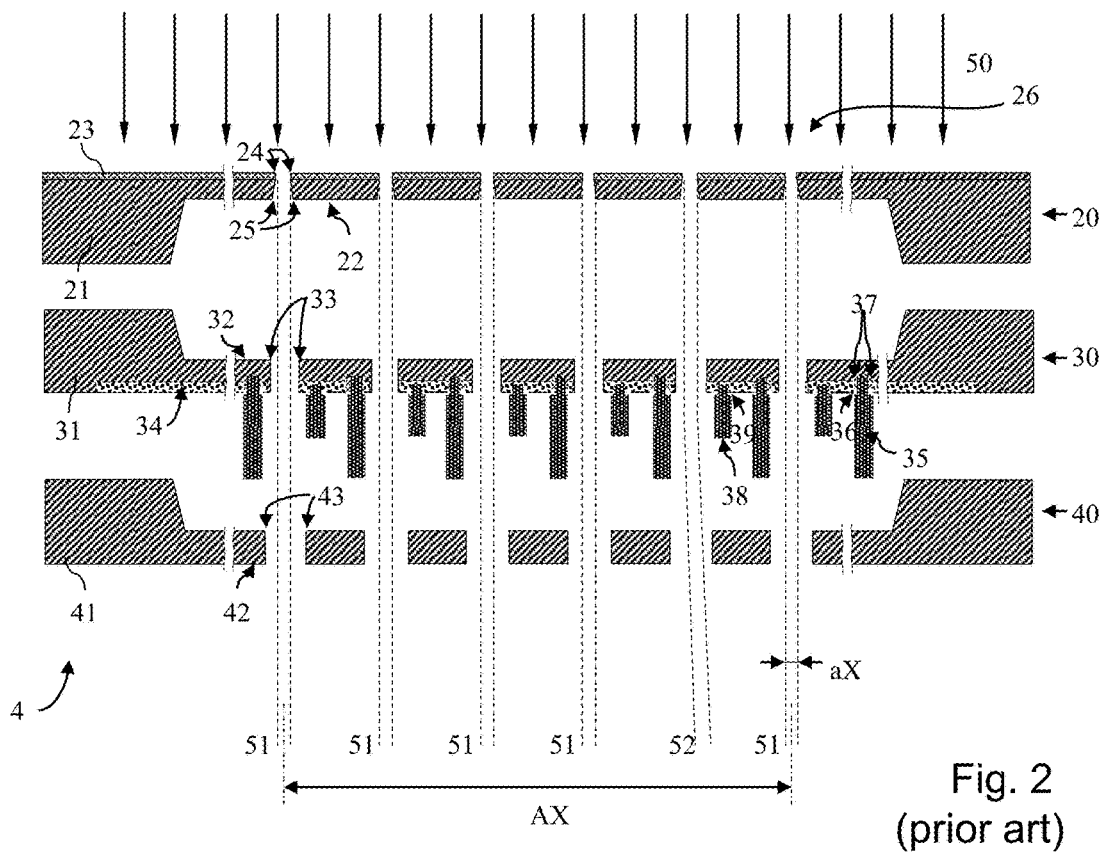
FIG. 2 illustrates a cross section view of an Aperture Array Plate in accordance with prior art for MBW systems.

An overview of a lithographic apparatus suitable to employ exemplary embodiments of the invention is illustrated in FIGS. 1 and 2. In accordance with many embodiments the lithographic apparatus as illustrated in FIG. 1 may comprise an illumination system 3 coupled to a Pattern Definition (PD) system 4 which focuses the beam through a projecting system 5 onto a target station 6. The target station generally contains a substrate for which the projected image is to be directed to.

In many embodiments the illumination system 3 comprises, for instance, an electron gun 7, an extraction system 8 as well as a condenser lens system 9. It should, however, be noted that in place of electrons, in general, other electrically charged particles can be used as well. Apart from electrons these can be, for instance, hydrogen ions or heavier ions, charged atom clusters, or charged molecules.

The extraction system 8 accelerates the particles to a defined energy of typically several keV, e.g. 5 keV. By means of a condenser lens system 9, the particles emitted from the illumination source 7 are formed into a broad, substantially telecentric particle beam 50 serving as Lithography Beam 19a. The Lithography Beam 19a then irradiates a PD system 4 which comprises a number of plates with a plurality of openings (also referred to as apertures). The PD system 4 is held at a specific position in the path of LB, which thus irradiates the plurality of apertures and/or openings and is split into a number of beamlets 51 and 52.

Some of the apertures/openings are "switched on" or "open" so as to be transparent to the incident beam in the sense that they allow the portion of the beam that is transmitted through it, i.e. the beamlets 51, to reach the target; the other apertures/openings are "switched off" or "closed", i.e. the corresponding beamlets 52 cannot reach the target. Thus, effectively these apertures/openings are non-transparent (opaque) to the beam. Thus, the Lithography Beam 19a is structured into a Patterned Beam 19b, emerging from the PD system 4. The pattern of switched on apertures is chosen according to the pattern to be exposed on the substrate 16 covered with charged-particle sensitive resist 17. It has to be noted that the "switching on/off" of the apertures/openings is usually realized by a suitable type of deflection means provided in one of the plates of the PD system 4: "Switched off" beamlets 52 are deflected off their path (by sufficient albeit very small angles) so they cannot reach the target but are merely absorbed somewhere in the lithography apparatus, e.g. at an absorbing plate 11.

The pattern as represented by the patterned beam 19b is then projected by means of an electro-magneto-optical projection system 5 onto the substrate 16 where the beam forms an image of the "switched-on" apertures and/or openings. In accordance with various embodiments, the projection system 5 may implement a demagnification of, for instance, 200:1 with two crossovers c1 and c2. In many embodiments the substrate 16 may be a 6" mask blank or a silicon wafer covered with a particle sensitive resist layer 17. The substrate is held by a chuck 15 and positioned by a substrate stage 14 of the target station 6.

The information regarding the pattern to be exposed is supplied to the PD system 4 by the data path realized by means of an electronic pattern information processing system 18. The data path is explained further below in section "Datapath."

In accordance with many embodiments the projection system 5 may include a number of consecutive electro-magneto-optical projector stages 10a, 10b, 10c, which preferably include electrostatic and/or magnetic lenses, and possibly other deflection means. The projection system 5 employs a demagnifying imaging through crossovers c1, c2. The demagnification factor for both stages is chosen such that an overall demagnification of several hundred results, e.g. 200:1 reduction. A demagnification of this order is in particular suitable with a lithography setup, in order to alleviate problems of miniaturization in the PD device.

In the whole projection system 5, provisions may be made to extensively compensate the lenses and or deflection means with respect to chromatic and geometric aberrations.

As a means to shift the image laterally as a whole, i.e. along a direction perpendicular to the optical axis 19, deflection means 12a, 12b, and 12c may be provided in the condenser 3 and projection system 5. The deflection means may be realized as a multi-pole electrode system which is either positioned near the source extraction system 8 or one of the crossovers c1 and c2, as shown in FIG. 1 with the deflection means 12b, or after the final lens 10c of the respective projector, as in the case with the stage deflection means 12c in FIG. 1. In many embodiments, a multipole electrode arrangement is used as deflection means both for shifting the image in relation to the stage motion and for correction of the imaging system in conjunction with the charge-particle optics alignment system. These deflection means 10a, 10b, 10c are not to be confused with the deflection array means of the PD system 4 in conjunction with the stopping plate 11, as the latter are used to switch selected beamlets of the patterned beam 19b "on" or "off", whereas the former only deal with the particle beam as a whole. In some embodiments a solenoid 13 may be used to rotate the ensemble of programmable beams providing an axial magnetic field.

Turning now to FIG. 2 which illustrates an exemplary embodiment of a PD system 4. The embodiment of a PD system 4, may comprise three plates stacked in a consecutive configuration: An "Aperture Array Plate" (AAP) 20, a "Deflection Array Plate" (DAP) 30 and a "Field-boundary Array Plate" (FAP) 40. It is worthwhile to note that the term 'plate' refers to an overall shape of the respective device, but does not necessarily indicate that a plate is realized as a single plate component even though the latter is usually the preferred way of implementation; still, in certain embodiments, a 'plate', such as the aperture array plate, may be composed of a number of sub-plates. The plates are preferably arranged parallel to each other, at mutual distances along the Z direction which is represented by the vertical axis in FIG. 2.

In various embodiments the flat upper surface of AAP 20 forms a defined potential interface to the charged-particle condenser optics/illumination system 3. The AAP may, for example be made from a square or rectangular piece of a silicon wafer (approx. 1 mm thickness) 21 with a thinned center part 22. The plate may be covered by an electrically conductive protective layer 23 which will be particularly advantageous when using hydrogen or helium ions further illustrated in U.S. Pat. No. 6,858,118 which disclosure is incorporated herein by reference. When using electrons or heavy ions (e.g. argon or xenon), the layer 23 may also be of silicon provided by the surface section of 21 and 22, respectively, so that there is no interface between layer 23 and the bulk parts 21, 22.

In accordance with many embodiments the AAP 20 may comprise a plurality of apertures 24 formed by openings traversing the thinned part 22. The apertures 24 are arranged in a predetermined arrangement within an aperture area provided in the thinned part 22, thus forming an aperture array 26. The arrangement of the apertures in the aperture array 26 may be, for instance, a staggered arrangement or a regular rectangular or square array. In various embodiments, the apertures 24 are realized having a straight profile fabricated into the layer 23 and a "retrograde" profile in the bulk layer of the AAP 20 such that the downward outlets 25 of the openings are wider than in the main part of the apertures 24. Both the straight and retrograde profiles can be fabricated with state-of-the-art structuring techniques such as reactive ion etching. The retrograde profile strongly reduces mirror charging effects of the beam passing through the opening.

As illustrated in FIG. 2 according to various embodiments the DAP 30 may be a plate provided with a plurality of openings 33, whose positions correspond to those of the apertures 24 in the AAP 20. Additionally, the openings 33 may be configured with electrodes 35, 38 configured for deflecting the individual beamlets passing through the openings 33 selectively from their respective paths. The DAP 30 can, for instance, be fabricated by post-processing a CMOS wafer with an ASIC circuitry. In accordance with some embodiments the DAP 30 may be of a square or rectangular shape and comprise a thicker part 31 forming a frame holding a center part 32 which has been thinned (but may be suitably thicker as compared to the thickness of the tinned part 22). The aperture openings 33 in the center part 32 are wider compared to 24 (by approx. 2 μm at each side for instance). In some embodiments CMOS electronics 34 may be utilized to control the electrodes 35, 38, which are provided by means of MEMS techniques. In accordance with various embodiments each opening 33, may contain a "ground" electrode 35 and a deflection electrode 38 adjacent thereto. The ground electrodes 35 may be electrically interconnected, connected to a common ground potential, and comprise a retrograde part 36 to prevent charging and an isolation section 37 in order to prevent unwanted shortcuts to the CMOS circuitry. The ground electrodes 35 may also be connected to those parts of the CMOS circuitry 34 which are at the same potential as the silicon bulk portions 31 and 32.

In accordance with some embodiments the deflection electrodes 38 may be configured to be selectively applied with an electrostatic potential; when such electrostatic potential is applied to an electrode 38, this will generate an electric field causing a deflection upon the corresponding beamlet, deflecting it off its nominal path. Additionally, the electrodes 38 may have a retrograde section 39 in order to avoid charging. Each of the electrodes 38 is connected at its lower part to a respective contact site within the CMOS circuitry 34.

In many embodiments the ground electrodes 35 may be higher than the height of the deflection electrodes 38 in order to suppress cross-talk effects between channels. Although the electrodes 35 and 38 are illustrated in a specific configuration, it should be understood that they may take on any suitable configuration for example the electrodes may face upstream rather than downstream as illustrated in FIG. 2.

The arrangement of a PD system 4 with a DAP 30 shown in FIG. 2 is only one of several possibilities. In a variant (not shown) the ground and deflection electrodes 35, 38 of the DAP may be oriented upstream (facing upward), rather than downstream. Further DAP configurations, may be utilized, such as those described in U.S. Pat. No. 8,198,601 whose disclosure is incorporated herein by reference.

In accordance with various embodiments the third plate 40 serving as FAP may have a flat surface facing the first lens part of the down-stream demagnifying charged-particle projection optics 5 and thus provides a defined potential interface to the first lens 10a of the projection optics. The thicker part 41 of FAP 40 may be a square or rectangular frame made from a part of a silicon wafer. The FAP 40 may further comprise a thinned center section 42. In accordance with many embodiments the FAP 40 may be provided with a plurality of openings 43 which correspond to the openings 24, 33 of the AAP 20 and DAP 30 but are wider as compared to the latter.

In accordance with many embodiments the PD system 4, and in particular the first plate of it, the AAP 20, may be illuminated by a broad charged particle beam 50 (herein, "broad" beam means that the beam is sufficiently wide to cover the entire area of the aperture array formed in the AAP), which is thus divided into many thousands of micrometer-sized beamlets 51 when transmitted through the apertures 24. The beamlets 51 will traverse the DAP and FAP unhindered.

As already mentioned, whenever a deflection electrode 38 is powered through the CMOS electronics, an electric field will be generated between the deflection electrode and the corresponding ground electrode, leading to a small but sufficient deflection of the respective beamlet 52 passing therethrough (FIG. 2). The deflected beamlet can traverse the DAP and FAP unhindered as the openings 33 and 43, respectively, are made sufficiently wide. However, the deflected beamlet 52 is filtered out at the stopping plate 11 of the sub-column (FIG. 1). Thus, only those beamlets which are unaffected by the DAP will reach the substrate.

The ensemble of (unaffected) beamlets 51 as formed by AAP may be projected to the substrate with a predefined reduction factor R of the projection charged-particle optics. Thus, at the substrate a "beam array field" (BAF) is projected having widths $BX=AX/R$ and $BY=AY/R$, respectively, where AX and AY denote the sizes of the aperture array field along the X and Y directions, respectively. The nominal width of a beamlet at the substrate (i.e. aperture image) is given by $bX=aX/R$ and $bY=aY/R$, respectively, where aX and aY denote the sizes of the beamlet 51 as measured along the X and Y directions, respectively, at the level of the DAP 30. Thus, the size of a single aperture image formed on the target is $bX \times bY$ The reduction factor of the demagnifying charged-particle optics 5, as illustrated in FIG. 1, may be chosen in accordance with many embodiments in view of the dimensions of the beamlets and their mutual distance in the PD device 4 and the desired dimensions of the structures at the target. This will allow for micrometer-sized beamlets at the PD system whereas nanometer-sized beamlets are projected onto the substrate.

In many embodiments the beamlets 51 and 52 as represented in FIGS. 1 and 2, equate to a plurality of programmable beamlets. It is worthwhile to note that the individual beamlets 51, 52 depicted in FIGS. 1 and 2 represent a much larger number of beamlets, typically many thousands, arranged in a two-dimensional X-Y array. In accordance with some embodiments there may be multi-beam charged-particle optics with a reduction factor of R=200 for ion as well as electron multi-beam columns with many thousands (e.g., 262,144) programmable beamlets. In some embodiments columns with a BAF of approx. 82 μm×82 μm may exist at the substrate.

Pattern Exposure

Figure 3:
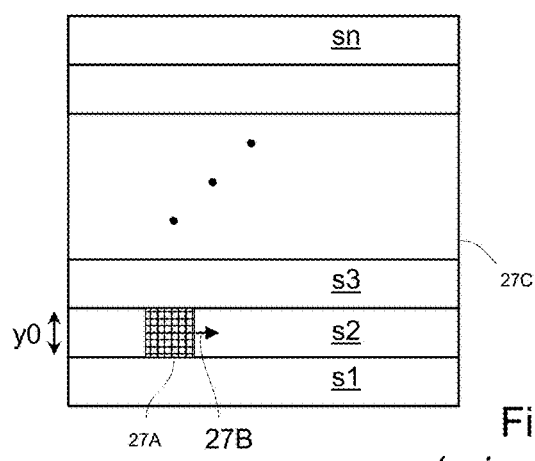
FIG. 3 illustrates a writing strategy on a target using stripes arranged along a common scanning direction in accordance with prior art teachings.

Turning now to FIG. 3 regarding defining the pattern to be exposed on the target. In many embodiments a pattern image 27A to be produced on the target 16 is defined by the PD system 4. The target surface covered with the charged-particle sensitive resist layer 17 may comprise one or more areas 27C to be exposed. Generally, the pattern image 27A exposed on the target has a finite size y0 which is usually smaller than the width of the area 27C to be exposed. Therefore, a scanning stripe exposure strategy may be utilized, where the target is moved under the incident beam, thus changing perpetually changing the position of the beam on the target. It is emphasized that for the purpose of the invention only the relative motion of the pattern image 27A on the target is relevant. In many embodiments the relative movement of the pattern image 27A over the target area 27C may form a sequence of exposure stripes s1, s2, s3, . . . sn having the same width as the pattern image 27A. The complete set of stripes covers the total area of the substrate surface. In various embodiments the scanning direction 27B may be uniform or may alternate from one stripe to the next.

Turning now to FIG. 4, many embodiments of the invention may have various image patterns 28A as illustrated by the pixel 28B pattern of FIG. 4. In accordance with many embodiments the pixel 28B may be exposed with varying levels of intensity thus producing an image level different in a variety of pixels, which is best illustrated by the table in FIG. 4. 401, 402, and 403 illustrate the various levels of intensity in accordance with some embodiments. The full gray level 401 can be seen in various pixels 28C while a reduced gray level can be seen in other pixels 28D. Thus the "switched on" beamlets as determined by the PD system 4 and the Pattern Information Processing System 18, may be capable of exposing the substrate to a variety of intensity levels to produce the desired image. The number and intensity of pixels exposed at any given time during the process may vary as the number of apertures capable of being "switched on" at a given time is predetermined by the physical parameters of the PD system.

In accordance with many embodiments the intensity or varying level of which the pixel is exposed may be determined by the sequence of apertures activated to produce the pattern on the desired pixel location. For example, while the substrate 16 moves, the same image element corresponding to a pattern pixel 28B on the target may be exposed many times by the images of a sequence of apertures.

The image pattern may be shifted through the apertures of the PD system. In some embodiments, for example, all apertures may be switched on when such apertures are directed to a specific pixel location. The result would be the maximum exposure level to that pixel thus producing a "white" shade. Yet in many embodiments the number of "switched on" apertures may vary thus producing a variety of exposure dose levels; accordingly producing a variety of gray levels on the substrate. In some embodiments the dose level may be minimum equating to a "black" shade. Thus in an actual pattern not all pixels are exposed to the full dose of the aperture array plate due to various apertures being "switched off."

In some embodiments the dose level is regulated by reducing the duration of unblanked exposure for the apertures involved. Thus, the exposure duration of one aperture image may be controlled by a discrete number of gray levels; each of which represents a particular dose to be applied on the substrate/target, e.g. 0, $1/(n_Y-1)$ ..., $i/(n_Y-1)$, ..., 1 with $n_Y$ being the number of available "pixel gray levels" and i an integer ("gray index", $0 \leq i \leq n_Y$). Generally, however, the dose increments need not be equidistant and form a non-decreasing sequence between 0 and 1. The exposed aperture image may be the manifestation of one of a given numbers of gray shades that correspond to zero and the maximum exposure duration and dose level.

FIG. 5 illustrates an arrangement of apertures in the aperture field of the PD device, in accordance with various embodiments of the invention. Aperture images 53A as may be projected to the target are illustrated in dark. The main axes X and Y correspond to the direction of advance of the target motion (scanning direction 27B) and the perpendicular direction, respectively. Each aperture image has widths bX and bY along the directions X and Y respectively. The apertures are arranged along lines and rows having MX and MY apertures, respectively, with the offset between neighboring apertures in a line and row being NX·bX and NY·bY respectively. In various embodiments based on the layout of the apertures each aperature image may have a resulting conceptual cell 53B having an area of NX·bX·NY·bY, and the aperture arrangement contains MX·MY cells arranged in a rectangular way. For simplicity the conceptual cell may be referred to as an "exposure cells". In accordance with many embodiments the complete aperture arrangement, as projected onto the target, has dimensions of BX=MX·NX·bX by BY=MY·NY·bY. In some embodiments the grid may assume a square shape as a special case of a rectangular grid, and set b=bX=bY, M=MX=MY, and N=NX=NY with M being an integer. In such configurations an "exposure cell" 53B has a size of N·b×N·b on the target substrate.

Figure 6A:
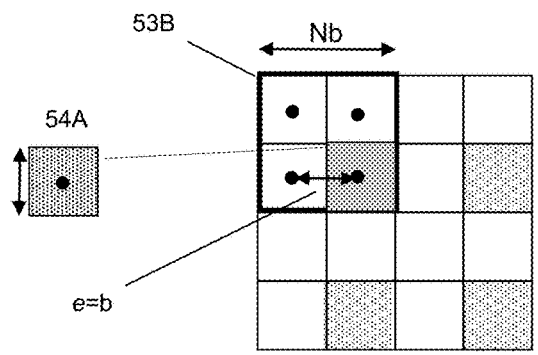
FIG. 6A illustrates an arrangement of apertures in accordance with prior art teachings.
Figure 6B:
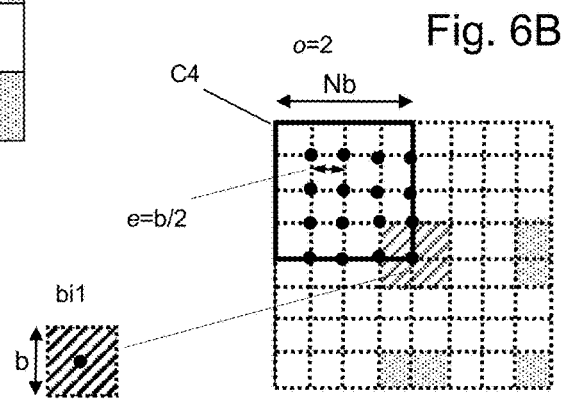
FIG. 6B illustrates an example oversampling of the pixels in a "double grid" arrangement.

Turning now to FIG. 6A, in accordance with many embodiments the pitch between two neighboring exposure positions may be denoted as e. In general, the distance e can be different from the nominal width b of an aperture image. In some embodiments b=e, which is illustrated in FIG. 6A. FIG. 6a in accordance with various embodiments illustrates an arrangement of exposure cells 53B in a 2×2 pattern where one aperture image 54A covers (the nominal position of) one pixel. In other embodiments, as illustrated in FIG. 6B, e may be a fraction b/o of the width b of the aperture image, with o>1 being preferably (but not necessarily) an integer which we also refer to as the oversampling factor. Such examples are further illustrated by U.S. Pat. Nos. 8,222,621 and 7,276,714 which disclosures are incorporated herein by reference. In this case the aperture images, in the course of the various exposures, will spatially overlap, allowing a higher resolution of the placement of the pattern to be developed. It follows that each image of an aperture will, at one time, cover multiple pixels, namely $o^2$ pixels. The entire area of the aperture field as imaged to the target will comprise $(NMo)^2$ pixels. From the point of view of placement of aperture image, this oversampling corresponds to a so-called placement grid which is different (since it is finer in spacing) than what would be necessary to simply cover the target area.

FIG. 6B further illustrates an exemplary embodiment of an oversampling of o=2 combined with placement grids, namely, the image of an aperture array with an exposure cell C4 having parameters o=2, N=2 ("double-grid"). Thus, on each nominal location (small square fields in FIG. 6B) four aperture images 55A (dashed lines) are printed, which are offset on a regular grid by pitch e in both X and Y directions. While the size of the aperture image still is of the same value b, the pitch e of the placement grid is now b/o=b/2. The offset to the previous nominal location (offset of the placement grid) is also of size b/2. At the same time, the dose and/or the gray shade of each pixel may be adapted (reduced), by choosing a suitable gray value for the aperture image that cover the respective pixel. As a result, an area of size b×b is printed but with an enhanced placement accuracy due to the finer placement grid. Direct comparison of FIG. 6B with FIG. 6A shows that locations of aperture images are just arranged on a placement grid twice (generally, o times) as fine as before, while the aperture images themselves overlap. The exposure cell C4 now contains $(No)^2$ locations (i.e., "pixels") to be addressed during the write process and thus, by a factor of $o^2$, more pixels than before. Correspondingly, the area bi1 with the size of an aperture image b×b is associated with $o^2=4$ pixels in the case of oversampling with o=2 in FIG. 6B. Of course, o may take any other integer value as well, in particular 4 ("quad-grid", not shown) or 8, or also a non-integer value greater one, such as $\sqrt{2}=1.414$.

Figure 7:
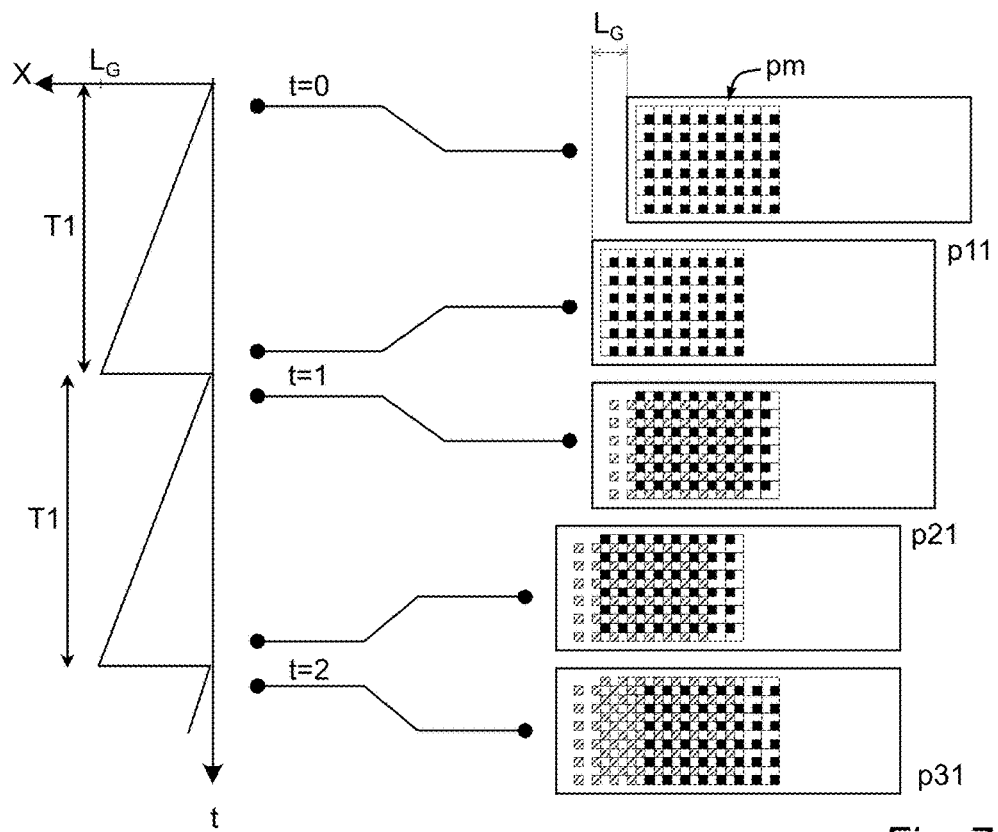
FIG. 7 illustrates an exemplary embodiment of an exposure scheme of pixels of one stripe in accordance with prior art teachings.

In accordance with many embodiments an exposure scheme of the pixels, which is suitable for the invention is illustrated in FIG. 7. As illustrated in FIG. 7 is a sequence of frames, with increasing time from top (earlier) to bottom (later). The parameter values in this figure are o=1, N=2; also, a rectangular beam array is assumed with MX=8 and MY=6. In some embodiments, the target may move continuously to the left, whereas the beam deflection is controlled with a seesaw function as shown on the left side of FIG. 7. During each time interval of length T1, the beam image stays fixed on a position on the target (corresponding to a position of a "placement grid"). Thus, the beam image is shown to go through a placement grid sequence p11, p21, p31. One cycle of placement grids is exposed within a time interval L/v=NMb/v, by virtue of the target motion v. The time T1 for exposure at each placement grid corresponds to a length $L_G=vT1=L/(No)^2=bM/No^2$, which we call "exposure length."

In many embodiments the beamlets are moved over the distance of $L_G$ during the exposure of one set of image elements together with the target. In other words, all beamlets maintain a fixed position with regard to the surface of the substrate during the time interval T1. After moving the beamlets with the target along distance $L_G$, the beamlets are relocated to start the exposure of the image elements of the next placement grid. After a full cycle through the positions p11 . . . p31 of a placement grid cycle, the sequence starts anew, with an additional longitudinal offset L=bNM parallel to the X direction (scanning direction). At the beginning and at the end of the stripe the exposure method may not produce a contiguous covering, so there may be a margin of length L that is not completely filled.

Figure 8A:
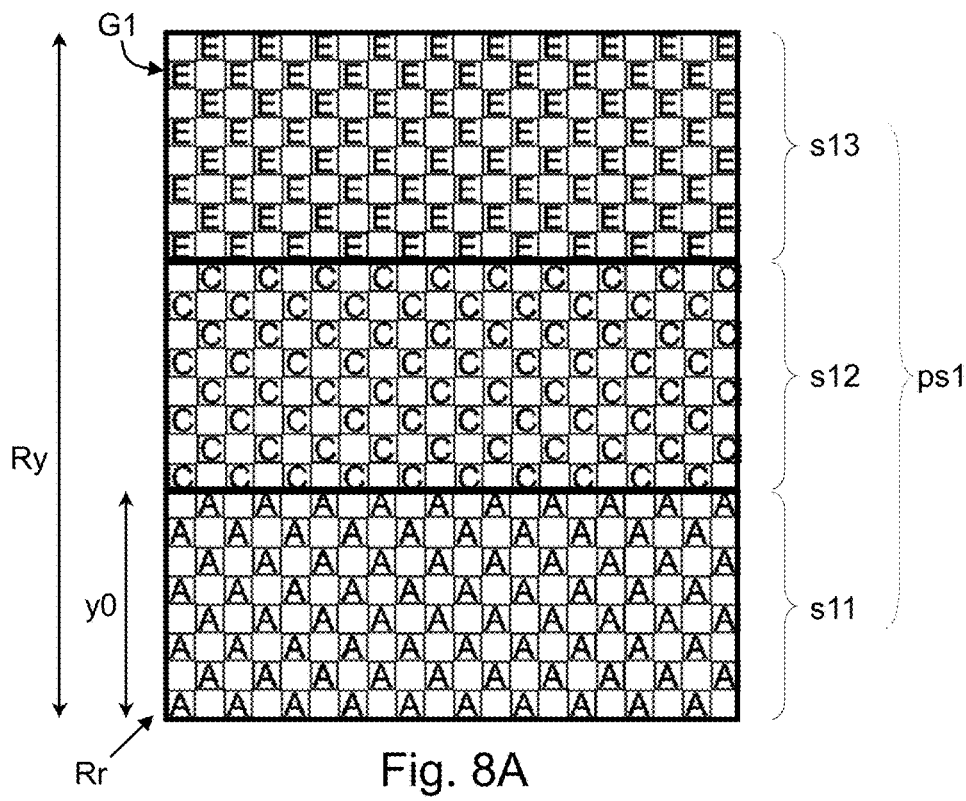
FIGS. 8A and 8B illustrate the overlapping stripe ("multi-pass") strategy for the example of two passes in accordance with many embodiments.
Figure 8B:
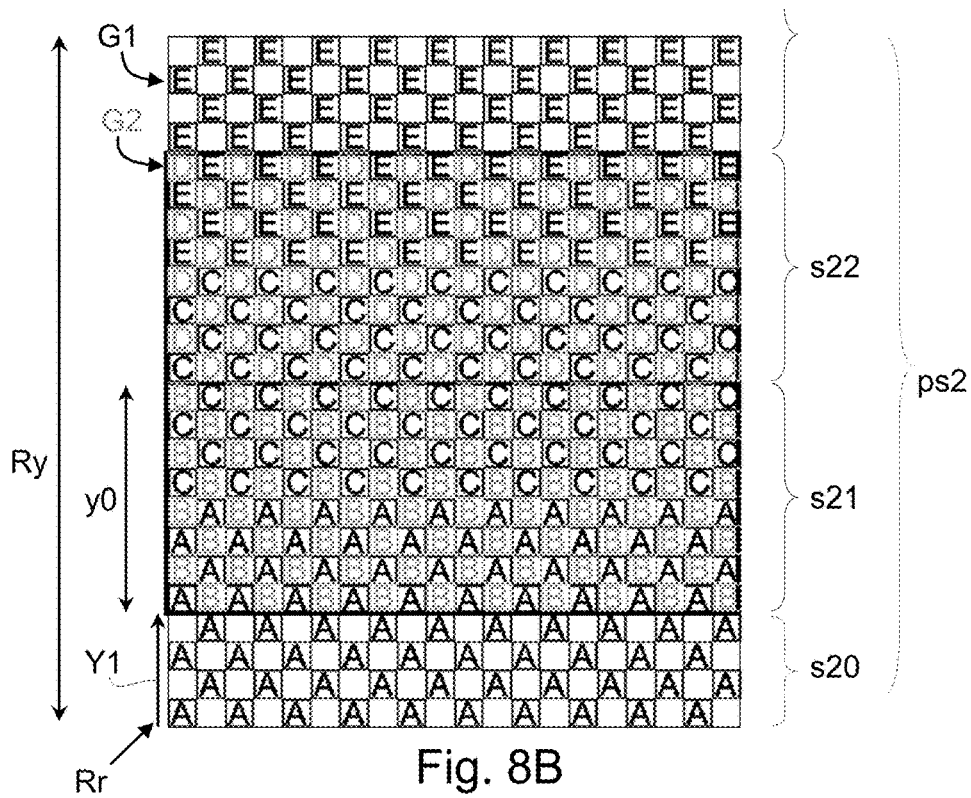

In various embodiments an overlapping stripe ("multi-pass") strategy for error reduction may be used. Similar strategies are described in U.S. Pat. No. 9,053,906 B2 which disclosure is incorporated herein by reference. An exemplary embodiment ("double-pass") is illustrated in FIGS. 8A and 8B, which show an exemplary sub-area of the target to be exposed in two passes ps1, ps2. In the first pass ps1 the stripes s11, s12, s13 are exposed in consecutive order, thus exposing the pixels belonging to a partial grid G1 (the number of pixels within each of the stripes is reduced in the depiction of FIGS. 8A and 8B for the sake of clarity and may be higher in typical embodiment). In FIG. 8A, letters A, C, E denote the pixels which are exposable through stripes s11, s12, and s13, respectively. The stripes s11-s13 of one pass are preferably located side-by-side, so as to produce a continuous grid over the area on the target. In this way, the stripes, each having individual width y0, may cover the total width Ry of the area Rr to be exposed along the Y direction (i.e., across the scanning direction sd). In many embodiments, the stripes s11-s13 may extend to either side of the area shown, and the first pass ps1 may continue with further stripes (not shown) after the stripe s13 has been imaged. After completion of all stripes of the first pass ps1, the stripes of another pass ps2 are performed, as illustrated in FIG. 8B.

As illustrated in FIG. 8B, the stripes s21, s22 may expose pixels formed within the second partial grid G2. FIG. 8B shows two stripes s21, s22, which expose the pixels denoted by letters B and D, respectively. Thus, each pass ps1, ps2 is associated with one of the partial grids G1, G2 of pattern pixels which are exposable during the respective pass. Taken together, the pixels of the grids G1, G2 combine to the complete plurality of pattern pixels in the region which is to be exposed. In other words, the second pass ps2 exposes those pixels which are left out in the first pass ps1, and vice versa. With regard to the Y axis the exposure stripes of different passes are mutually overlapping, preferably in a regular manner wherein the overlapping stripes, for instance of stripes s11 and s21, differ by a transversal offset Y1 along the Y direction (which is the direction across the orientation of the stripes, identical to the scanning direction). For exposing the first half of the stripe s11, and to also cover this part of the total width Ry, an additional 'edge stripe' s20 (not indicated in the pixel pattern) may be performed, in which only the upper half of the pixels are exposed, while the lower half of the pixels are kept switched-off along the entire length of the stripe s20. In accordance with many embodiments of the invention there may be more than two passes; for instance, in a "quad-pass" writing strategy, four partial grids written in four passes may be combined to form the complete plurality of pattern pixels. Further details concerning the exposure of the pixels through exposure stripes and partial grids are described in U.S. Pat. Pub. No. 2016/0276131 A1 which disclosure is incorporated herein by reference.

Turning now to FIG. 9A, a graphical illustration of the ideal intensity profile 71 for a line of a width 30 nm, in the idealized case of zero blur is presented. When using "quad-grid" (o=4) multi-beam exposure the overlap is a quarter of the beam size. Thus, for the case of 20 nm beam size the physical grid size is 5 nm. A discrete dose level can be assigned to each area of the physical grid, which may be 5 nm×5 nm in some embodiments. The line 72 in FIG. 9A indicates the superposition of the intensity (or total dose) as it is composed by the overlapping exposure spots with discrete dose levels assigned to the pixel positions for generating the 30 nm line, whereas for better visibility the blur has been set to zero (so that the dose distribution of a single exposure spot becomes a rectangle). If the blur has a realistic value, the step function at the edge of the rectangle is convoluted with a Gaussian function, which eventually transforms to a Gaussian shape. In that sense the line 72 can be seen as superposition of Gaussian functions at blur zero. In many embodiments the dose level histogram will not be symmetrical in order to position the left and right edge at pre-defined positions.

In accordance with many embodiments, FIG. 9B represents a graphical illustration of a simulation for a line of 30.0 nm width, with the left edge to be positioned at 0.0 nm and the right edge at 30.0 nm. For the simulation, it was assumed that beam spots of 20 nm are exposed with 5.1 nm 1sigma blur (i.e., 12.0 nm FWHM blur). The intensity profile 76 is formed by overlapping the profiles of the exposure spots 73, 74, and 75. The dose level of the leftmost exposure spot 74 is adjusted such that the 30 nm line starts at the desired start position 77, i.e. at 0 nm. The dose level of the rightmost exposure spot 75 is adjusted such that exposed line ends at position 78 at 30.0 nm. As can be seen in FIG. 9B, in accordance with "quad-grid" exposure, the overlap of the exposure spots 73, 74, 75 is a quarter of the beam size, i.e. 5 nm.

FIGS. 9C and 9D illustrate how the invention enables the MBW device to write lines with precise edge definitions in accordance with many embodiment of the invention. In each figure, the top frame shows the edge position error vs. line width, the middle frame illustrates the intensity profile, and the bottom frame shows the edge position deviation when enhancing the exposure dose by 10% vs. line width. FIG. 9C shows the intensity profile obtained for a 31.4 nm line width, and FIG. 9D for a 40.0 nm line width. Using the MBW with 20 nm beam size and quad-grid exposure (5 nm physical grid size), the line width of the structure generated by the exposure can be changed in steps of 0.1 nm. Because of the integer dose levels, there may be slight deviations from the 0.1 nm address grid. These deviations are indicated as "edge position error" (top frames), as functions of the desired line width, in 0.1 nm steps between 30.0 nm and 40.0 nm. As can be seen the deviations are within ±0.05 nm. Furthermore, the change of edge position with 10% change of dose is only approx. 1 nm, varying only slightly with change of line width as shown in the bottom frames. In other words, since the dose is controlled in a MBW to better than 1%, the change of edge position with 1% change of dose is within approx. one atomic layer.

In accordance with many embodiments of the invention dose variations may be utilized in the MBMW to achieve edge placement with sub-pixel precision. FIG. 10 illustrates the exposure of one exposure spot with a maximum dose level. In the exemplary case of a 4-bit coding, there are 16 dose levels (0, 1, 2, ... 15), i.e. the maximum dose level is the sum of 15 dose level increments 64.

Turning now to FIGS. 11A, 11B, and 11C, intensity profile diagrams illustrating how the multi-beam exposure methods can achieve a fine positioning of structure feature with resolution smaller than the grid size. In the intensity profile diagrams, like those of FIGS. 11A-C, the discrete dose levels are visualized as rectangles 64 of uniform height, piled up in a "brick-layer" arrangement; of course, this "brick-layer" depiction is only symbolical and intended to facilitate interpretation of the drawings.

FIG. 11A shows a dose level histogram, for an exemplary embodiment of a line of 30 nm width exposed by means of a 4 bit (i.e., 15 dose levels per spot) exposure in a quad-grid with a beam spot size of 20 nm width. The grid size 62 is ¼ of the linear size of the exposure spots, which are symbolized as rectangles piled up in a "brick-layer" arrangement, and the resulting dose level distribution 65 is outlined as a bold line.

The line width can be made smaller or larger in very fine steps, which are smaller than the grid size, in this case the quad-grid size 62. Reducing the line width can be achieved by lowering the dose level of the outermost exposure spots and/or omitting exposure spots (the latter when the reduction is at least about one half of an exposure spot size). Increasing the line width can be achieved by enhancing the dose level of the outermost exposure spots and/or, in particular when the maximum dose level has been reached, by adding an additional, preferably overlapping, exposure spot. The latter aspect is illustrated in FIG. 11B: an exposure spot 66 having a defined dose level is added, resulting in a dose level histogram 67 for the line with larger width compared to 65. By combining these effects of decreasing and increasing on either side, there is also the possibility to shift the line position in very fine steps. FIG. 11C illustrates a shift of the line without changing the width, which is achieved by removing dose levels from spot 68 and adding dose levels from spot 69, resulting in the dose level histogram 70 which corresponds to a line shifted to the right as compared to the line of FIG. 11A.

The intensity profiles illustrated in FIGS. 11A-C are shown along the X direction of the target plane. It should be understood that the multi-beam exposure methods illustrated here may be applied to lines along other directions as well, and fine positioning can be achieved for lines at any angle on the target plane.

Dose Inhomogeneity Correction

U.S. Pat. Pub. No. 2015/0347660 A1, which disclosure is incorporated herein by reference, illustrates the current transmitted by each beamlet (or aperture) may not be uniform but may vary, mainly as a function of the distance to the optical axis 19 (FIG. 1). This effect is due to imperfections in the charged particle source. Without further corrections, the dose a pixel may receive will thus vary depending on the beamlet writing said pixel, leading to systematic edge placement errors.

Figure 12:
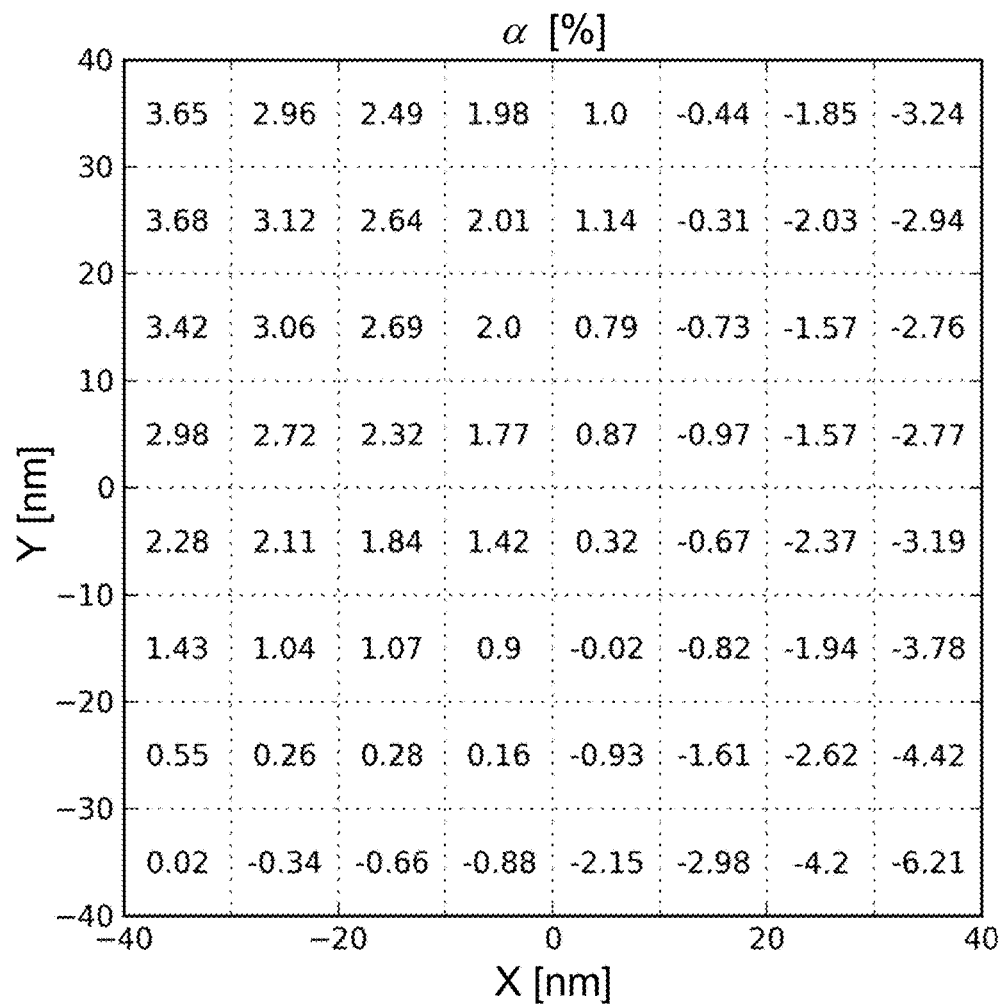
FIG. 12 illustrates an example of a measured current density map in accordance with many embodiments.

FIG. 12 illustrates an exemplary embodiment of a current density map Mp. More precisely, it shows a 8×8 coarse grained map of the deviation α(X,Y) (quantified in percentage [%]) of the current of a single beamlet located at a position/areal (X,Y) relative to the mean current across the image field. Typically, in the map the current dose values near the corners of the beam array are either reduced or enhanced with regard to the average over the map. In the example of FIG. 12 the beam array field of 82 μm×82 μm at the target consisted of 512×512=262,144 programmable beamlets. As shown, an 8×8 matrix of the current dose distribution was measured, wherein each measured value comprises 262,144/64=16,384 beamlets used to generate the respective value. The electron source underlying FIG. 12 was of the type of a thermal field emission cathode with a flat emitter surface (single crystal, e.g. Tungsten or $LaB_6$). Since the electrons are emitted from a larger surface (typically 20 μm), it is unavoidable due to mechanical imperfection (e.g. alignment of emitter surface with respect to anode) or local differences in the extraction field strength, that the angular current density varies across the emitter.

In accordance with many embodiments dose variations may be corrected by updating the dose corresponding to a pixel by dividing by a homogenizing "dose correction factor" q depending on the beamlet writing said pixel, which is given by $q=C(1+\alpha)$, where $C=1/[\min_{[X,Y]} (1+\alpha(X,Y))]$ is a constant that fixes the minimum dose inhomogeneity correction factor at 1. (Here the symbol $\min_{[X,Y]}$ is the minimum value among the values within the entire range of interest of X and Y coordinates.) This correction typically happens on-line as part of the data path.

Data Path

Figure 13:
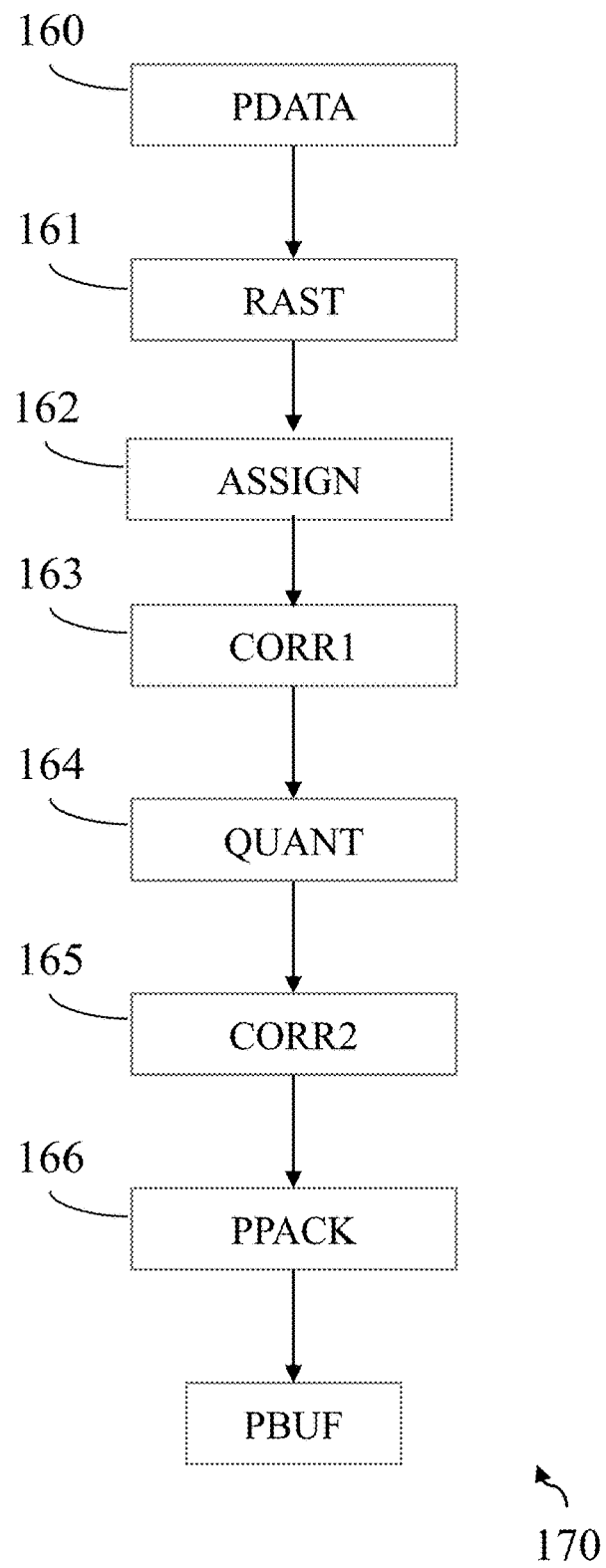
FIG. 13 is illustrative of an exemplary embodiment of a data path of an MBW.

In accordance with many embodiments the MBW integrates a processing system 18, as illustrated in FIG. 1, that converts the patterns to be written to beamlet dose assignments (as described above), which can be used in the writing process, is referred to as "data path" system. In accordance with many embodiments, FIG. 13 shows a flowchart of a data path 170 in the context of the invention. The data path is preferably performed in real time; in a variant, part or all of the calculations of the data path may be performed in advance, for instance in a suitable computer.

The complete pattern image may comprise a vast amount of image data, which is why for efficient computation of those data a high-speed data path that generates the pixel data to be exposed, preferably in real-time, will be suitable. The pattern to be exposed is typically described in a vector format, for example as a collection of geometries like rectangles, trapezoids or general polygons, which typically offers better data compaction and therefore reduces the requirements on data storage. Therefore, in accordance with many embodiments, the data path may consist of three major parts:

- a vector-based physical correction process (step 160),
- rasterization processes to translate the vector to pixel data (steps 161 to 164), and
- buffering of pixel data for temporary storage for the writing process (steps 165 and 166).

As illustrated in FIG. 13, the data path starts upon being supplied a pattern PDATA to be exposed at step 160. In step 160, generally, the pattern PDATA to be exposed may be split into a large number of small data chunks, possibly with geometric overlaps. Corrections that can be applied in the vector domain (e.g. proximity effect correction) may be carried out to all chunks independently, possibly in parallel, and the resulting data is sorted and coded so as to improve computation speed of subsequent steps. The output is a collection of chunks where all chunks contain a collection of geometries.

Stage 161 as illustrated in FIG. 13 may be referred to as the Rasterization stage: RAST. The geometries of every chunk are converted into rasterized pixel graphics. In this step, each pixel may be assigned a floating-point gray scale intensity depending on the geometric overlap of the corresponding surface of the raster-grid cell with the pattern to be exposed, i.e. the entity of all associated chunks. This floating-point intensity represents the ideal physical exposure dose to be delivered onto the target at the respective pixel location. Furthermore, every pixel that is completely inside a geometry may be assigned the maximal intensity, whereas the intensity of pixels that crosses an edge of a geometry is weighted by the fraction of the area of the pixel that is covered by the geometry. This method implies a linear relation between the area of the geometry and the total dose after the rasterization.

Stage 162 as illustrated in FIG. 13 may be referred to as the Pixel-to-beamlet assignment stages: ASSIGN. In this step, given a particular write sequence, it is determined which pixel will be written by which beamlet.

Stage 163 as illustrated in FIG. 13 may be referred to as the Pixel based corrections stage: CORR1. In this step, all corrections that can be applied in the pixel domain may be performed. These corrections comprise compensation of deviations from a uniform current density of the beam 50 over the aperture field, as described earlier and further illustrated in U.S. Pat. No. 9,495,499; whose disclosure is incorporated herein by reference. Additionally, the corrections may be for individual defective beam deflectors in the DAP 30. Further illustration is provided in U.S. Pat. No. 9,269,543; which disclosure is incorporated herein by reference. Pixel based corrections are realized by modifying the floating-point intensity of each individual pixel. This is being done with respect to the Pixel-to-beamlet assignment of Stage 162, which makes it possible to define and apply a compensation dose-factor q (or, equivalently a dose-shift s) for each pixel depending on by which beamlet it is written, and/or by which beamlets the neighboring pixels are written.

Stage 164 as illustrated in FIG. 13 may be referred to as the Quantization stage: QUANT. The quantization process converts the possibly corrected, floating-point intensity of each pixel into a quantized (or equivalently 'discrete') gray level, given a predetermined gray value scale.

Stage 165 as illustrated in FIG. 13 may be referred to as a second pixel based correction stage or CORR2 may be for further optional pixel based corrections in the gray-level pixel data domain (not part of the present invention).

Stage 166 as illustrated in FIG. 13 may be referred to as Pixel packaging, PPACK. The pixel image obtained from stage 164 is sorted according to the placement grid sequence and sent to a pixel buffer PBUF which is provided in the processing system 18 of the writer tool (FIG. 1). The pixel data is buffered until a sufficient amount of data, typically at least the length of a stripe, is present, which triggers the exposure of the stripe (see FIG. 7). The data is taken out of the buffer during the writing process. After the stripe has been written, the process described above starts anew for the pattern data of the next region, such as the next stripe.

Dose-Level Quantization

The present invention pertains to the QUANT stage 164 of the data path, which converts the floating-point (or equivalently high-resolution) intensity data into a quantized (i.e. discrete) gray level scale. In a typical realization of the invention the gray-level data is finally represented by a low-bit code, i.e., a code expressed through a small number of data bits. For instance, in a scenario where every pixel is described by 4 bits, pixels that are switched on have $2^4=16$ possible configurations, i.e. $n_y=16$ dose levels (0, 1, 2, ..., 15). In a realization where the minimum dose 0% and the maximum dose 100% is equidistantly divided into 16 discrete dose levels, the step between two dose levels is 100%/15=6.67%.

Figure 14:
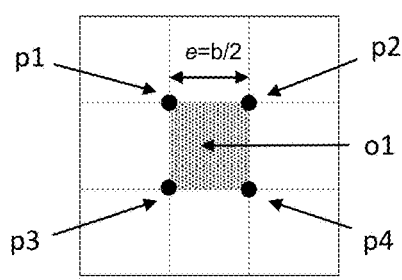
FIG. 14 illustrates an exemplary embodiment of double-grid oversampling.
Figure 15:
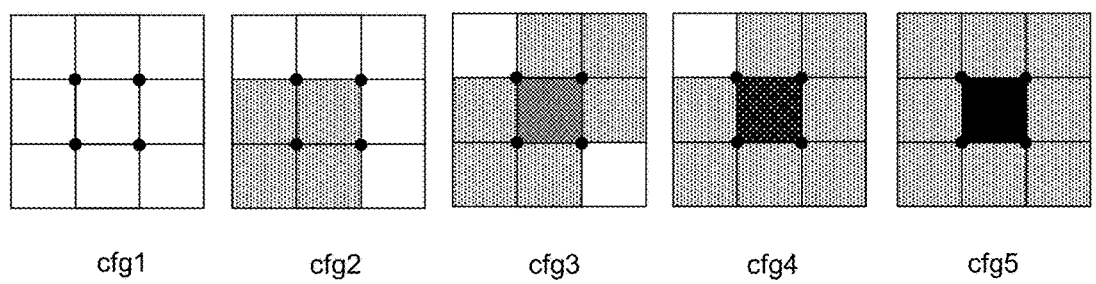
FIG. 15 illustrates possible configurations of dose in accordance with various embodiments.

In accordance with various embodiments finer dose-steps may be achieved via a suitable approach that exploits for oversampling o>1 to improve the discretization by means of a dithering process. The main principle of altering the dose in steps finer than 6.67% is illustrated in FIGS. 14 and 15. In FIG. 14, four neighboring pixels p1, p2, p3 and p4 for the example of double-grid oversampling (o=2) are shown. Since the pitch between neighboring pixels is e=b/2, each overlapping area of size $e^2=b^2/4$ is simultaneously covered by four beamlets. As the individual pixels each carry a 4-bit wide information, there are now 4×15+1=61 possible dose levels. Thus, the dose on the substrate can effectively be altered in steps of 6.67%/4=1.67% in contrast to the 6.67% for the individual pixels. In FIG. 15, the dose of the overlapping area o1 in the middle (dashed area) is considered. Starting from dose zero on all four neighboring pixels cfg1, the dose-level of o1 is increased by one, resulting in configuration cfg2 where the dose in the overlapping area is now 1 out of 4×15=60 possible non-zero dose-level configurations. Thus, the overall dose has increased by only 1/60=1.67%. FIG. 15 shows all possible 4+1=5 dose configurations cfg1, cfg2, cfg3, cfg4, cfg5 of the overlapping area for the case of two-dose levels, e.g. the pair 0 and 1, for the individual pixels p1, p2, p3 and p4. The skilled person easily realizes that any of the 60 possible non-zero dose-levels can be obtained by a combination of 4 pixels with 15 non-zero dose-levels. The finer gray level scale achievable in the overlapping area will be referred to as "effective gray levels" in the following.

As the number of overlapping pixels only depends on the oversampling factor o, it is straight-forward to compute the number of dose levels for any combination of oversampling o and gray-level n-bit resolution. In detail, the number of overlapping pixels is $o^2$, resulting in $o^2 \times (2^n-1)+1$ effective gray-levels in steps of $1/(o^2 \times (2n-1)+1)$. Besides the mentioned cases of oversampling o=2 and bit-resolution n=4, another interesting scenario with respect to the implementation of the applicant is o=4 (so-called quad-grid-mode) and n=4, where $n_y=4^2 \times (2^4-1)+1=241$ effective dose-levels are available, which can be varied in steps of 0.4167%. It will be evident to the skilled person that other combinations of o and n may be suitable depending on the individual implementation.

A computationally inexpensive algorithm is required which, starting from a desired floating-point pixel intensity, determines a proper discrete gray-level assignment for neighboring pixels. Besides the requirement of being computationally inexpensive, this algorithm will have to ensure that the entire range of $o^2 \times (2^n-1)+1$ effective dose-levels can be exploited.

Quantization Using Ordered Dithering

Due to its ease of calculation and deterministic behavior, ordered dithering is a method particularly suited for dose level discretization. During ordered dithering quantization, for every pixel (aperture image position) the fractional gray level value of the nominal dose is compared against a threshold value in a regular pattern obtained from a Bayer index matrix which is used as dithering matrix. The dose is then rounded up to the next dose step if it surpasses the threshold and rounded down otherwise. In general, the relationship between threshold matrix T and Bayer index matrix B (which describes the order in which beamlets are rounded up for increasing target dose) is given by $$T_{ij} = \frac{2B_{ij} - 1}{2d^2} (i, j = 1, \ldots, d)$$

where d is the dithering order, i.e., the size of the dithering matrix B, which is usually quadratic. The dithering order d may be conveniently chosen equal to the oversampling factor o. Given the fundamental Bayer matrix B2 of FIG. 17A, Bayer matrices of arbitrary dimensions which are powers of two can be calculated recursively, namely, starting from the 2×2 matrix $B_2$=B2 and using the recursion rule $$B_{2n} = \begin{pmatrix} 4 \times (B_n - 1) + 1 & 4 \times (B_n - 1) + 3 \\ 4 \times (B_n - 1) + 4 & 4 \times (B_n - 1) + 2 \end{pmatrix}$$

where $B_n$ is a Bayer matrix of dimension n×n

Figures 16, 17A, 17B:
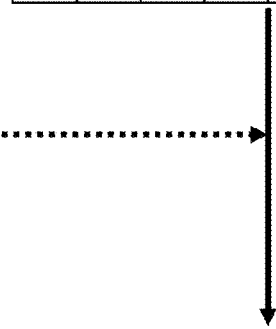
FIG. 16 illustrates an embodiment of dithering with o=2.
FIG. 17A illustrates the index matrix used in the dithering matrix in accordance with FIG. 16.
FIG. 17B illustrates the threshold matrix used in the dithering matrix in accordance with FIG. 16.

A simplified example for the application of a dithering matrix for rounding is presented in FIG. 16, relating to the case of two pixel gray levels (that is, every pixel has 1-bit data; thus, it can only be switched on or off) and double-dithering (i.e. d=2). The array NP2 represents an example of a desired pattern, in which each entry contains a value of the dose to be exposed at the respective area element on the target (target dose values, also referred to as nominal dose values). In the example shown, the array contains several instances of values 0, 0.1, 0.5, and 1. FIG. 17A shows a dithering matrix B2 of size 2×2 for d=2, and FIG. 17B shows the threshold matrix T2 resulting from the dithering matrix B2. The threshold matrix T2 is tiled in the plane in a regular pattern to obtain the threshold pattern TP2 (left-hand part of FIG. 16). The dimensions of the threshold pattern TP2 will suitably conform to the dimensions of the desired pattern array NP2 (top of FIG. 17). According to the dithering procedure, rounding is achieved comparing the nominal dose value in each entry of the pattern NP2 with the corresponding entry of the threshold pattern TP2, resulting in a quantized array QP2, which contains an array of dose values quantized to conform to the available gray values. In this example, the nominal dose values of 0.5 (half a pixel gray level) are rounded up and down in an alternating pattern, whereas doses of 0.1 are rounded down everywhere. The other dose values which occur in the target dose, i.e. 0 and 1, remain unchanged since they exactly match a pixel gray level Another example is given in FIGS. 18, 19A, and 19B for the same target pixel doses y in a pattern array NP4, but using quad-dithering (d=4) with a 4×4 dithering matrix B4 (FIG. 19A), and 4 (2-bit) pixel gray levels. The 2-bit information of one gray value means that a the available discrete gray values h form a palette having $2^2$=4 values, for instance, 0 (zero), ⅓, ⅔, and 1. Each element will be assigned a quantized value h chosen from the palette based on the original pattern. FIG. 19B shows the threshold matric T4 which is calculated from the dithering matrix B4. In FIG. 18 the resulting threshold pattern TP4 is illustrated. During the process of dithering from the desired pattern array NP4 to the quantized array QP4, the nominal dose values of 0.5 are rounded in an alternating pattern to the next pixel gray levels of ⅓ and ⅔, since the remainder of the subtraction 0.5−⅓=⅙, when divided by the step-size of the gray scale, i.e. ⅓, gives ⅜, which is larger than 5/32 and 15/32, but smaller than 20/32 and 17/32. Similarly, half of the pixel dose values of 0.1 are rounded up to ⅓ (since 0.1/(⅓)=0.3 is greater than 9/32 and 1/32) and the other half are rounded down to 0 (since 0.3 is smaller than 19/32 and 25/32). It should be noted that the values of the entries shown in the matrices T4 and TP4 are scaled by an overall factor of 1/32 (indicated outside the respective matrix).

The general procedure for arbitrary dithering order d and bits per pixel n is as follows:

1. Decompose every nominal dose value into the form y=c*k+r, where the dividend k is the step-size, i.e. the step width of the gray scale, as determined by the number of bits n, i.e. k=1/($2^n$−1), and where the integer quotient c and (positive real-valued) remainder r are determined uniquely according to the Euclidean division theorem. In particular, the quotient c is a non-negative integer, and the remainder is a non-negative number r<k.
2. Compare the value v=r/k with the associated entry of the dithering threshold matrix. If this value v is larger than the entry from the dithering threshold matrix, the pixel is a assigned the discrete grey-level h=(c+1)*k; whereas if v is less than or equal to said threshold value, the pixel is assigned the discrete grey-level h=c*k.

Thus, in the second step, a floating point nominal dose value y (unless it already coincides with one of the values in the gray scale palette) is either rounded up or down, relative to the discrete grey-level scale with step-size k.

Ordered Dithering and Dose Corrections

The combination of oversampling, dose corrections, and ordered dithering can lead to complex stochastical effects. Various exemplary embodiments consider the case of double-grid exposure (o=2) and $n_y$=16, i.e. 16 gray levels (4-bit) for every pixel/beamlet and double-dithering (using the dithering matrices of FIGS. 17A+B). As in FIG. 14, an overlapping area o1 is exposed by four overlapping aperture image positions p1, p2, p3, p4, giving a total of 61 gray levels. Since this corresponds to dose increments of 1/60=1.67%, the maximal dose error due to quantization is 0.84% (½ effective gray level or ⅛ pixel gray level) when using optimal rounding. When using ordered dithering for quantization, this error may become larger, particularly in the presence of inhomogeneous beam current and corresponding corrections as described earlier.

Figure 20:
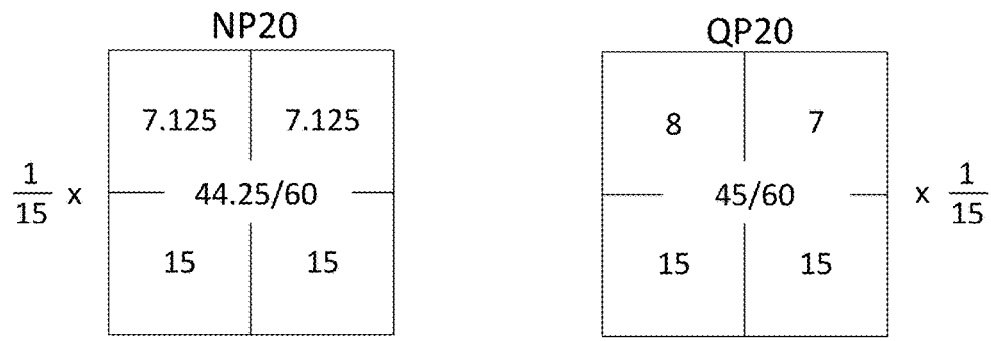
FIG. 20 illustrates an exemplary embodiment of the dithering process.

FIG. 20 illustrates an exemplary embodiment for the case of homogeneous beam current. Consider a typical use-case, where a line through the upper half of the overlapping area o1 is to be exposed, as illustrated in the target dose array NP20. The beamlets at pixels p3, p4 are to deliver a maximal dose of 1, and the beamlets at p1, p2 a dose of 7.125/15=0.475 to produce a total o1 dose of 44.25/60=0.7375 of the maximal overlap dose 4. Applying the dithering matrix to obtain the quantized array QP20, the pixel p1 is rounded up to the next discrete gray level 8, whereas the pixel p2 is rounded down to 7; the pixels b3, b4 remain unchanged. The two roundings combine to an overlap dose error of 0.75/60=1.25% (which experimentally corresponds to a line edge placement error in the order of approx. 0.4 nm).

Figure 21:
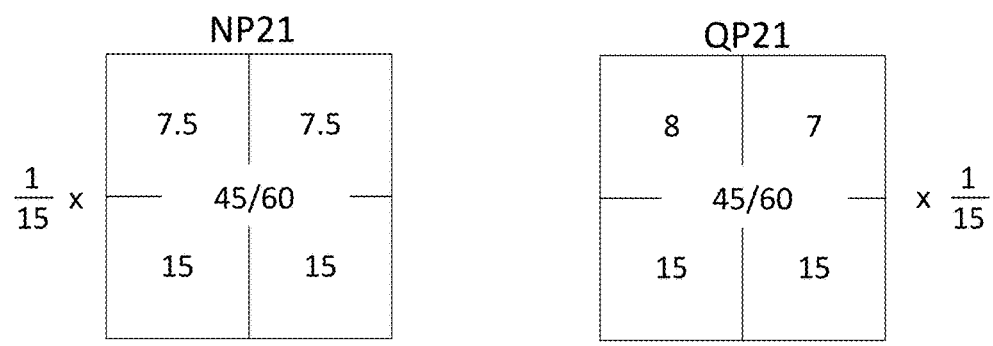
FIG. 21 illustrates another exemplary embodiment of the dithering process.

While in this example, the rounding error is larger than the ideal quantization error, it is the worst case scenario when writing a line with this dithering matrix and homogeneous beamlet doses. Also note that this is not a generic error that occurs when using ordered dithering, which means that there are also cases where there is no rounding error at all. Consider for example the case in FIG. 21. Here, the target dose value (array NP21) for the overlapping area o1, namely 45, is exactly matched when using the ordered dithering process as visible from the resulting quantized array QP21, even though the target dose of pixels p1, p2 lies between two discrete values; namely 7 and 8.

In the case of inhomogeneous beamlet current the rounding behavior can be much worse. This is due to the fact that the corrected doses may align with the dithering thresholds in an unfavorable way. An example is given in FIG. 22, comprising the same target dose values NP20 as in the case of FIG. 20, but with additional dose inhomogeneity correction factors. While the target dose is the same as in FIG. 20, due to the fact that the beamlets carry different amounts of current, the doses assigned to each pixel have to be adjusted with beamlet-dependent dose factors DF22 to effectively deliver the target doses DP22. Each pixel is now assigned an individual corrected dose, which, in some cases, can align unfavorably with the dithering thresholds. In FIG. 22, the worst possible rounding behavior is shown in the array NQ22 (all pixels are rounded up), leading to a total dose error of approximately 3.3% (45–43=2 out of 60 non-zero effective gray levels, or, equivalently ½ single pixel gray level), which, for the MBMW of the applicant, may experimentally correspond to an edge placement error of about 1.32 nm. This dose error also approximately remains in the effective dose (i.e., accounting for the different beamlet currents).

In accordance with many embodiments, the above scenario can be resolved by using the same or very similar dose correction values for overlapping pixels which undergo the dithering process. Consider, for example, FIG. 23; where, a common dose-correction-factor 0.972 (array DF23 has a uniform value) among the neighboring beamlets is applied which preserves the exact target dose, as can be seen in arrays DP23 and NQ23. That is, in the quantized dose distribution NQ23 the target dose of overlap o1 is still 43 as before, but with the advantage that when the ordered dithering is applied, no rounding error occurs at all.

Figure 26:
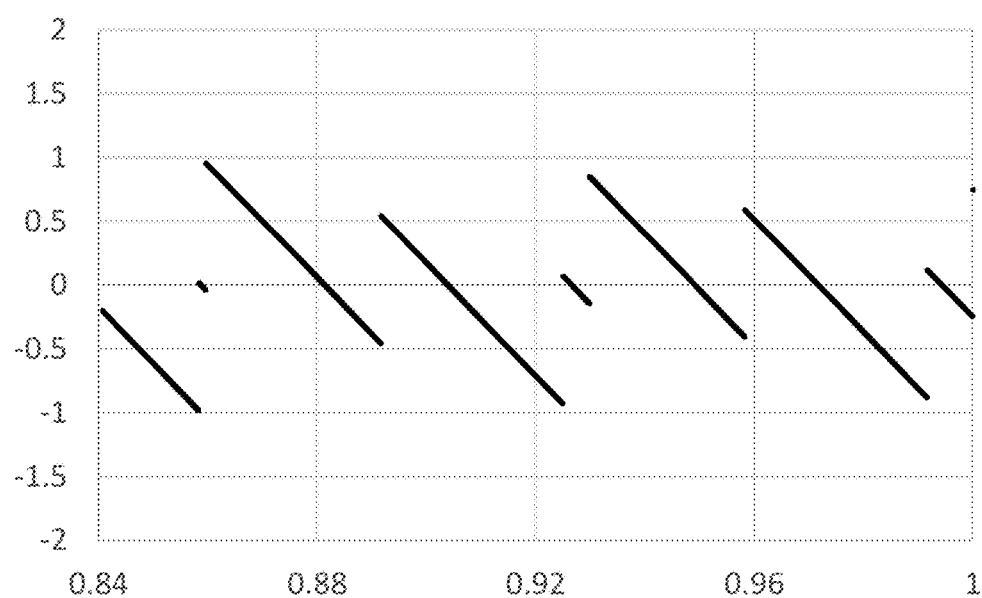
FIG. 26 illustrates a plot of the rounding error as a function of the nominal target dose.
Figure 33A:
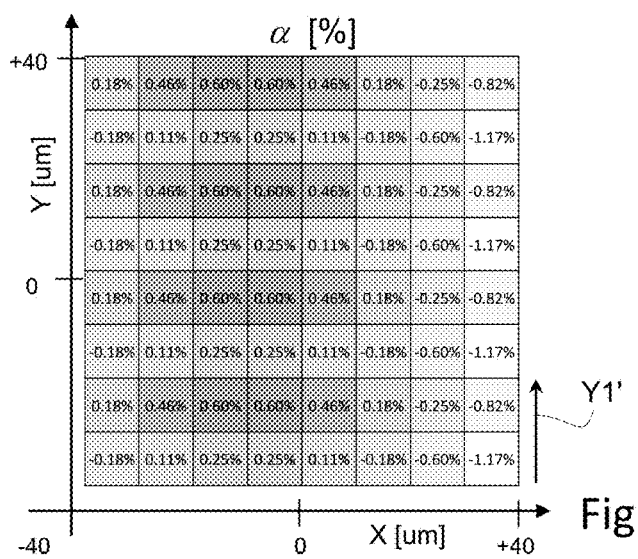
FIGS. 33A to 35B show current profiles, correction dose factors and corrected dose profiles in a manner analogous to FIGS. 27A to 29B respectively in accordance with various embodiments of the invention.
Figure 33B:
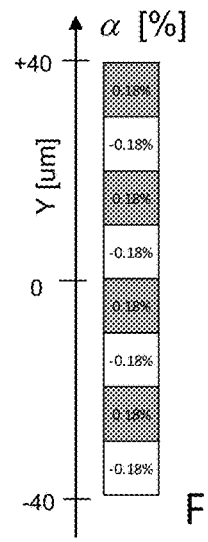
Figure 34A:
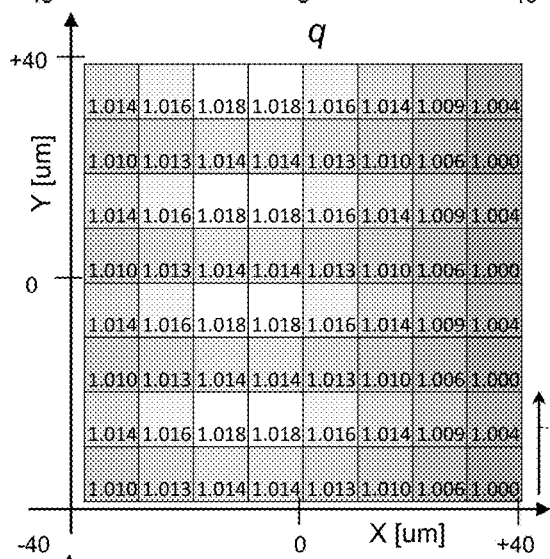
Figure 34B:
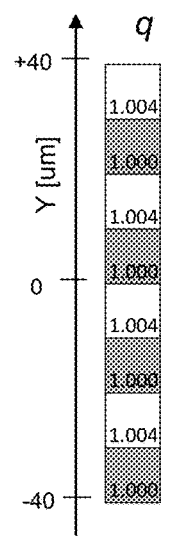
Figure 35A:
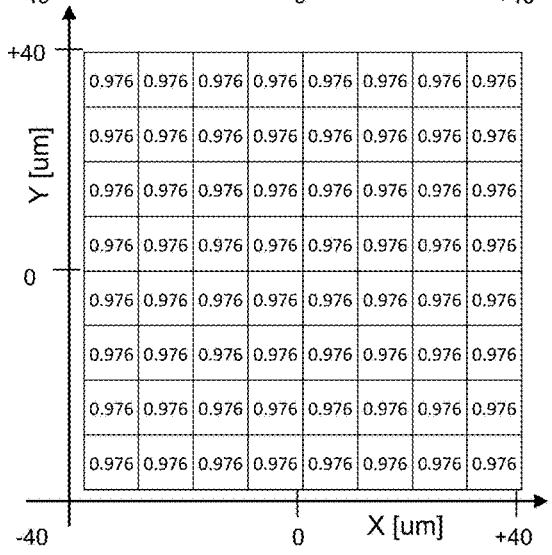
Figure 35B:
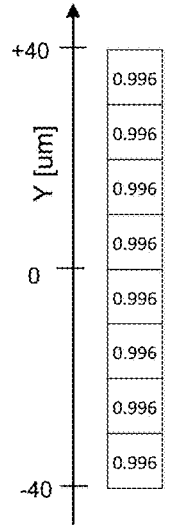

FIG. 26 illustrates a plot of the rounding errors (in terms of effective gray levels) for the target dose values from FIGS. 20 to 23 for the range 0.84 to 1.0 of common dose-correction factors for the four neighboring, and potentially overlapping pixels. Here, it may be observed that the worse-case rounding error of two effective gray levels does not occur. Instead, the maximal error is halved to one effective gray level.

In accordance with many embodiments FIGS. 27A to 35B, illustrate the advantageous behavior of dose correction factors during dithering by using a uniform dose correction for each aperture-line along the write direction (i.e., the scanning direction sd, see FIG. 3). FIG. 27A shows a typical case of a current profile (more exactly, current density profile) across the image-field of size 80 µm×80 µm, each value representing the deviation $\alpha(X,Y)$ (quantified in percentage [%]) of the current of a single beamlet located at the position (X,Y) of a respective area, relative to the mean current across the image field. The values listed in FIG. 27A depict a typical distribution according to a realistic scenario, with a roughly parabolic overall characteristic and a deviation range of several percent. Corresponding normalized correction dose factors q (see above, Section 'Dose inhomogeneity correction') are given in FIG. 28A, which are proportional to the multiplicative inverse of the doses from FIG. 27A. FIG. 29A shows the corrected dose profile: applying the factors from FIG. 28A to the measured doses shown in FIG. 27A yields a completely flat dose profile of constant value 0.960. Note that the overall dose is now lower by a constant 4% across the whole image-field. This decrement, however, can easily regained by increasing the overall source current by the corresponding amount.

The data in FIGS. 27A to 29A relate to the current profile, which corresponds to a (fictitious) pattern profile of uniform gray level y=1. In the case of a realistic pattern profile, where each of the pixels will receive an individual gray level value y with 0≤y≤1 (nominal dose value), the correction dose factors q are used to correct these nominal dose values y so as to compensate for the non-ideal current profile (FIG. 27A). This is done by dividing each nominal dose value y by the value q of the respective beamlet (FIG. 28A), so as to obtain a corrected dose value y'=y/q. This correction is made for each beamlet (i.e., each pixel or image element on the target) of the entire image field.

In order to avoid that the unfavorable worst-case rounding occurs, one computes the averaged dose profile along the scanning direction sd, which in this example is the X-axis. Re-normalized, this yields the effective dose-values shown in FIG. 27B, which can be corrected via the dose-correction factors given in FIG. 28B. Overall, the mean dose-intensity is reduced to the common value 0.974 as shown in FIG. 29B. This is another advantage of this aspect of the invention, namely that the minimum dose correction factor q is larger due to this averaging. This has the effect that more effective dose levels are available for writing a pattern, because the lower this number is, the more gray-levels are effectively needed for dose-inhomogeneity-correction.

While the worst-case rounding behavior (of two effective gray levels) described earlier only occurs by chance, it may appear systematically if an overlapping stripe strategy (=multipass) is applied as described in U.S. Pat. No. 9,053, 906; which disclosure is incorporated herein by reference. Consider again a double-grid double-dithering strategy with ordered dithering discretization as illustrated in FIG. 14. In addition, a double-pass writing strategy as described previously is applied, according to which the pixels p1, p4 will typically be written in one pass, whereas the pixels p2, p3 are written in the other pass. Pixels written in the same pass tend to have similar dose factors (as they originate from the same y-position of the charged particle source), or have already been equalized according to previously introduced method. Due to the structure of the dithering matrix, the pixels p1, p4 are more likely to be rounded up, whereas p2, p3 tend to be rounded down, leading to an intricate correlation between the dose factors and the rounding behavior, which under certain circumstances can introduce systematic edge placement errors across the beam-field when exposing a regular pattern.

An example is given in FIG. 24; the reference symbols correspond to those of FIGS. 22 and 23 mutatis mutandis. As before, the beamlets are assigned individual dose correction factors q, however, in this case a correlation between the dose factors and the dithering matrix arises. The solution presented in FIGS. 27 to 29, in which a common dose correction factor q is assigned to each aperture line improves the situation, but not to a satisfactory amount, because pixels p1, p4 and p2, p3 may now be written by beamlets from different aperture rows. Consequently, only two of the four dose factors will be identical. In this case, the maximal rounding error is again four times as large as the ideal quantization error with 3.33% (two effective gray levels). In some constellations, the error can be additionally increased due to the fact that beamlets from one pass now have the tendency to get rounded down, whereas for the other pass it is more likely that the beamlet is rounded up. In the example given in FIG. 24, for instance, the high-dose-factor beamlets have the tendency to be rounded down and low-dose-factor beamlets the tendency to be rounded up, leading to observable systematic CD errors with respect to the Y-position of a stripe.

The solution to this problem is presented in accordance with many embodiments and further illustrated in FIGS. 30A to 32B. First, an effective dose-profile is computed by averaging the dose profile $\alpha(X,Y)$ (quantified in percentage [%] of the current of a single beamlet located at a position $(X,Y)$ relative to the mean current across the image field) according to the (multipass) stripe overlap (compare with FIG. 8A and FIG. 8B). This stripe overlap is determined by the offset Y1 between overlapping stripes, Y1=y0/2. FIG. 30A shows the deviation $\alpha(X,Y)$ of the effective dose-profile from the mean value in percent. For this effective dose-profile, one then computes the corresponding correction factors, as illustrated in FIG. 31A. Optionally, the factors are additionally equalized along the X-direction, analogously, as for the non-overlapping stripe-exposure mode; this leads to the effective dose correction factors as illustrated in FIGS. 30B and 31B. In particular, using the common correction factors as depicted in FIG. 31B in the double-pass mode, where stripes from different passes overlap with 50% of their width (as also shown in FIGS. 8A and 8B), a maximal rounding error of 1 effective gray level is achieved, since the neighboring pixels from different passes now have the same dose correction factor q, as e.g. depicted in FIG. 25.

It is straightforward to generalize the procedure described above to other scenarios. For instance, the quad-pass variant is illustrated in FIGS. 33A to 35B. Here, the offset Y1' between overlapping stripes is ¼ of the stripe width y0, and every second image-field segment is averaged in Y-direction, corresponding to four passes; in other respects, the FIGS. 33A to 35B correspond to those of FIGS. 30A to 32B, respectively. Note again, that the minimum dose correction factor over the image-field becomes larger the more averaging is performed.

Although various embodiments are presented herein, it should be understood that any suitable embodiment may be utilized.

Doctrine of Equivalents

As can be inferred from the above discussion, the above-mentioned concepts can be implemented in a variety of arrangements in accordance with embodiments of the invention. For example, though the method for correcting the written pattern from a multibeam-writer is described in relation to the various components of the MBW, other arrangements may be contemplated within the scope of the current disclosure.

Accordingly, although the present invention has been described in certain specific aspects, many additional modifications and variations would be apparent to those skilled in the art. It is therefore to be understood that the present invention may be practiced otherwise than specifically described. Thus, embodiments of the present invention should be considered in all respects as illustrative and not restrictive.

What is claimed is:

1. A method for writing a desired pattern on a target, comprising:
    providing a pattern definition device having a plurality of apertures transparent to a source of radiation,
    directing an illuminating wide beam through the apertures of the pattern definition device to form a patterned beam consisting of a corresponding plurality of beamlets,
    illuminating a target with the patterned beam during a sequence of exposure intervals to form a pattern image on the target, wherein the pattern image is configured to form a plurality of pattern pixels on the target wherein the plurality of pattern pixels correspond to at least a portion of the plurality of apertures, and wherein during the sequence of exposure intervals, at least a portion of the plurality of apertures are selectively controlled such that the plurality of pattern pixels are exposed to a respective dose amount,
    generating a relative movement between the target and the pattern definition device to produce a stepwise movement of the pattern image on the target along a path over an exposure region, said path comprising a plurality sections which extend along a scanning direction, wherein the plurality of sections correspond to a plurality of exposure stripes that collectively cover the entirety of said exposure region over sequential exposures, wherein the exposure stripes are mutually overlapping and offset from each other in a direction transverse to the scanning direction, such that exposure region is exposed by at least two different exposure stripes at different transversal offsets, and
    calculating, for each pixel, a corrected dose amount by dividing the value of the nominal dose amount by a correction factor, wherein the same correction factor is used with pixels written by beamlets located at positions which differ only by said transversal offsets of overlapping stripes.

2. The method of claim 1, wherein during the step of calculating a corrected dose amount for each pixel, an available current density at the respective pixel is determined, wherein said maximum available current density is determined as the actual current density of the irradiating beam radiated through the aperture corresponding to the respective pixel, said correction factor of the respective pixel is calculated as the ratio of said available current density to the minimum current density across the overall beam array field, and correction factors are averaged among those pixels that are located at positions which differ only by said transversal offsets of overlapping stripes.

3. The method of claim 1, further comprising
    multiplicative renormalization of the correction factors, using a renormalizing factor chosen such that one of the largest value and the smallest value of the correction factors is renormalized to 1.

4. The method of claim 1, wherein the step of calculating a corrected dose amount for each pixel comprises calculating, for each pixel in a row of pixels parallel to the scanning direction within a respective exposure stripe, corrected dose amounts by dividing the values of the dose amounts by a row correction factor, wherein said row correction factor is uniformly applied to all pixels of a row of pixels.

5. The method of claim 4, wherein said row correction factor is calculated for a respective row of pixels based on the values of current dose actually radiated through a series of apertures, said series of apertures containing all apertures within the pattern definition device which impart dose amounts to the respective row of pixels, wherein the row correction factor of a row of pixels is calculated as the ratio of actual current dose of an aperture, as averaged over the corresponding series of apertures, to a nominal current dose value assumed to be constant over the plurality of apertures of the pattern definition device.

6. The method of claim 1, wherein said region where a beam exposure is to be performed is composed of a plurality of pattern pixels arranged in a regular arrangement, said region having a total width as measured across said scanning direction, said exposure stripes within said region running substantially parallel to each other along said scanning direction and having uniform widths as measured across said scanning direction.

7. The method of claim 6, wherein the exposure stripes are mutually overlapping, the position of the stripes differing by a transversal offset in a direction across the scanning direction, wherein the row correction factors of rows of pixels are averaged over those rows of pixels which are offset to each other by said transversal offset.

8. The method of claim 1, wherein the correction factor varies between groups of pixels where said groups of pixels differ by an offset which does not correspond to a transversal offset of overlapping stripes.

9. The method of claim 1, including computing an exposure pattern suitable for exposing the desired pattern on a target using said pattern definition device for writing said desired pattern by exposing a multitude of pixels within said region on the target, wherein during exposing the desired pattern on a target:

in said pattern definition device said plurality of blanking apertures is arranged in a predetermined arrangement defining mutual positions of the blanking apertures, each blanking aperture being selectively adjustable with regard to a dose value to be exposed through the respective blanking aperture onto a corresponding aperture image on the target during a respective exposure interval, said dose value taking a respective value in accordance with a discrete palette, said discrete palette including a number of gray values forming a scale ranging from a minimum value to a maximum value, during a writing process of said desired pattern, a sequence of exposure intervals is made, wherein in each exposure interval the blanking apertures are imaged onto the target, thus generating a corresponding plurality of aperture images, wherein the position of aperture images is kept fixed relative to the target at the position of a pixel during an exposure interval, but between exposure intervals the position of aperture images is shifted over the target, thus exposing the multitude of pixels on the target, and the aperture images are mutually overlapping on the target, and the aperture images have a nominal width which is greater than the distance between pixel positions of neighboring aperture images on the target, by an oversampling factor greater than one, wherein computing the exposure pattern comprises:
determining the discrete palette,
providing the desired pattern and calculating a nominal exposure pattern as a raster graphics defined on the multitude of pixel elements, said nominal exposure pattern being suitable to create a nominal dose distribution on the target realizing contour lines of the desired pattern and including for each pixel element a respective nominal dose value, and
determining, for each pixel element, a discrete value which approximates the nominal dose value of the respective pixel element, said discrete value being selected from the discrete palette, wherein determining the discrete values includes employing ordered dithering using a dither matrix of a predefined size.

10. The method of claim 9, wherein the dither matrix is a Bayer matrix.

* * * * *